US011828549B2

(12) United States Patent
Narasimhan et al.

(10) Patent No.: US 11,828,549 B2
(45) Date of Patent: Nov. 28, 2023

(54) INTEGRATED HEAT SINK AND AIR PLENUM FOR A HEAT-GENERATING INTEGRATED CIRCUIT

(71) Applicant: NVIDIA CORPORATION, Santa Clara, CA (US)

(72) Inventors: Susheela Narasimhan, Fremont, CA (US); Sanjay Choudhry, Sunnyvale, CA (US)

(73) Assignee: NVIDIA Corporation, Santa Clara, CA (US)

( * ) Notice: Subject to any disclaimer, the term of this patent is extended or adjusted under 35 U.S.C. 154(b) by 148 days.

(21) Appl. No.: 16/555,711

(22) Filed: Aug. 29, 2019

(65) Prior Publication Data
US 2020/0217599 A1 Jul. 9, 2020

Related U.S. Application Data

(60) Provisional application No. 62/788,659, filed on Jan. 4, 2019.

(51) Int. Cl.
*F28D 15/02* (2006.01)
*F28F 3/08* (2006.01)
(Continued)

(52) U.S. Cl.
CPC ............ *F28F 3/086* (2013.01); *F28D 1/0475* (2013.01); *F28D 15/02* (2013.01);
(Continued)

(58) Field of Classification Search
CPC ... H01L 23/427; F28D 15/02; F28D 15/0275; F28F 2215/04; H05K 7/20336
See application file for complete search history.

(56) References Cited

U.S. PATENT DOCUMENTS 5,162,974 A * 11/1992 Currie .................... H05K 7/20
165/185
5,651,414 A * 7/1997 Suzuki ............... F28D 15/0275
165/104.14
(Continued)

FOREIGN PATENT DOCUMENTS

EP    0 661 741 A1    7/1995
EP    2 784 812 A2    10/2014
(Continued)

OTHER PUBLICATIONS

International Search Report for application No. PCT/US2020/012270 dated Apr. 6, 2020.

*Primary Examiner* — Eric S Ruppert
(74) *Attorney, Agent, or Firm* — Artegis Law Group, LLP

(57) ABSTRACT

An electronic device includes an integrated circuit and a heat exchanger. The heat exchanger includes a heat pipe and a first plurality of cooling fins and a second plurality of cooling fins. The heat pipe is thermally coupled to the integrated circuit and has an evaporator portion and a condenser portion, where the condenser portion extends away from the evaporator portion. The first plurality of cooling fins are attached to the condenser portion and proximate to the evaporation portion and form a plenum having a first associated pressure drop when a cooling fluid flows across the first plurality of cooling fins at a first velocity. The second plurality of cooling fins are attached to the condenser portion and distal from the evaporation portion and form a flow path having a second associated pressure drop when the cooling fluid flows across the second plurality of cooling fins at the first velocity.

39 Claims, 25 Drawing Sheets

(51) Int. Cl.
*F28D 1/047* (2006.01)
*H05K 7/20* (2006.01)
*F28D 21/00* (2006.01)

(52) U.S. Cl.
CPC ........... *F28D 15/0275* (2013.01); *H05K 7/20* (2013.01); *F28D 2021/0029* (2013.01); *F28F 2215/04* (2013.01)

(56) References Cited

U.S. PATENT DOCUMENTS

| | | | | |
|---|---|---|---|---|
| 2006/0098414 | A1* | 5/2006 | Huang | H01L 23/427 |
| | | | | 361/709 |
| 2007/0147006 | A1* | 6/2007 | Peng | F28F 1/32 |
| | | | | 361/709 |
| 2010/0018669 | A1* | 1/2010 | Chen | H01L 23/467 |
| | | | | 165/80.3 |
| 2011/0073283 | A1 | 3/2011 | Huang | |
| 2011/0127012 | A1 | 6/2011 | Ma et al. | |
| 2012/0160455 | A1* | 6/2012 | Liu | H01L 23/427 |
| | | | | 165/104.26 |
| 2017/0305443 | A1* | 10/2017 | Nakashima | B61C 17/04 |

FOREIGN PATENT DOCUMENTS

| | | | | | |
|---|---|---|---|---|---|
| JP | 2000161880 | A | * | 6/2000 | ......... F28D 15/0275 |
| JP | 2000245155 | A | * | 9/2000 | |
| JP | 2003273299 | A | * | 9/2003 | |

* cited by examiner

INTEGRATED HEAT SINK AND AIR PLENUM FOR A HEAT-GENERATING INTEGRATED CIRCUIT

CROSS-REFERENCE TO RELATED APPLICATIONS

This application claims priority benefit of the United States Provisional Patent Application titled, "INTEGRATED HEAT SINK AND AIR PLENUM FOR A HEAT-GENERATING INTEGRATED CIRCUIT," filed on Jan. 4, 2019 and having Ser. No. 62/788,659. The subject matter of this related application is hereby incorporated herein by reference.

BACKGROUND OF THE INVENTION

Field of the Invention

Embodiments of the present invention relate generally to computer systems and, more specifically, to an integrated heat sink and air plenum for a heat-generating integrated circuit.

Description of the Related Art

In modern computing devices, central processing units (CPUs), graphics processing units (GPUs), and other integrated circuits (ICs) generate significant quantities of heat during use. This heat needs to be removed for the proper operation of the integrated circuit and computing device. For example, a single high-power chip, such as a CPU or GPU, can generate hundreds of watts of heat during operation, and, if this heat is not efficiently removed, the temperature of the chip can increase to a point at which the chip is at risk of being damaged. To prevent thermal damage during operation, many system implement clock-speed throttling when the operating temperature of the processor exceeds a certain threshold. Thus, in these systems, the processing speed of the high-power chip is constrained by both the chip design and how effectively heat is removed from the chip.

To reduce the impact that thermal constraints have on high-power chip performance, heat exchangers can be employed that allow high-power chips to operate at greater processing speeds and generate greater amounts of heat. As is well-understood, a heat exchanger transfers heat from a chip to ambient air, and the air then carries the heat away from the chip. Heat exchangers can include passive devices, such as heat sinks, or more complex heat-transfer devices, such as heat pipes. Heat sinks generally include an array of fins that increases the effective surface area of the chip exposed to ambient air, while heat pipes rely on phase transition (e.g., evaporation of a liquid) to efficiently transfer heat between two solid interfaces. In some instances, heat pipes are used in conjunction with heat sinks to increase the amount of heat that can be removed from a high-power chip.

Despite the use of heat exchangers and other thermal solutions, as the processing power of CPUs and GPUs and other integrated circuits continues to increase, the processing speeds of such high-power chip continue to be constrained by the rate at which heat can be removed from those chips. Furthermore, many modern chip-package architectures add thermal resistance between the high-power chip and the associated heat exchanger. For example, some chip-package architectures now include structures between the high-power chip and the heat exchanger, such as a protective lid or additional heat-generating chips stacked on the heat-generating chip. These intervening thermal resistances reduce the effectiveness of the heat exchanger.

As the foregoing illustrates, what is needed in the art are more effective techniques for removing heat from integrated circuits during operation.

SUMMARY

One embodiment of the present invention sets forth an electronic device that includes an integrated circuit (IC) and a heat exchanger. The heat exchanger includes at least one heat pipe and a first plurality of cooling fins and a second plurality of cooling fins. The at least one heat pipe is thermally coupled to the IC and has an evaporator portion and a condenser portion, where the condenser portion extends away from the evaporator portion. The first plurality of cooling fins are attached to the condenser portion and proximate to the evaporation portion and form a plenum having a first associated pressure drop when a cooling fluid flows across the first plurality of cooling fins at a first velocity. The second plurality of cooling fins are attached to the condenser portion and distal from the evaporation portion and form a flow path having a second associated pressure drop when the cooling fluid flows across the second plurality of cooling fins at the first velocity.

At least one technological advantage of the disclosed heat exchanger design relative to the prior art is that heat generated by an IC can be more efficiently removed from the IC, thereby enabling the IC to operate at higher processing speeds without overheating. A further advantage is that pressure drop across the disclosed heat exchanger is typically less than the pressure drop across conventional heat exchangers, which reduces fan power consumption and fan noise relative to conventional heat exchanger designs. These technological advantages provide one or more technological advancements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

In the following description, numerous specific details are set forth to provide a more thorough understanding of the various embodiments. However, it will be apparent to one of skilled in the art that the inventive concepts may be practiced without one or more of these specific details.

Heat Exchanger Description

Figure 1A:
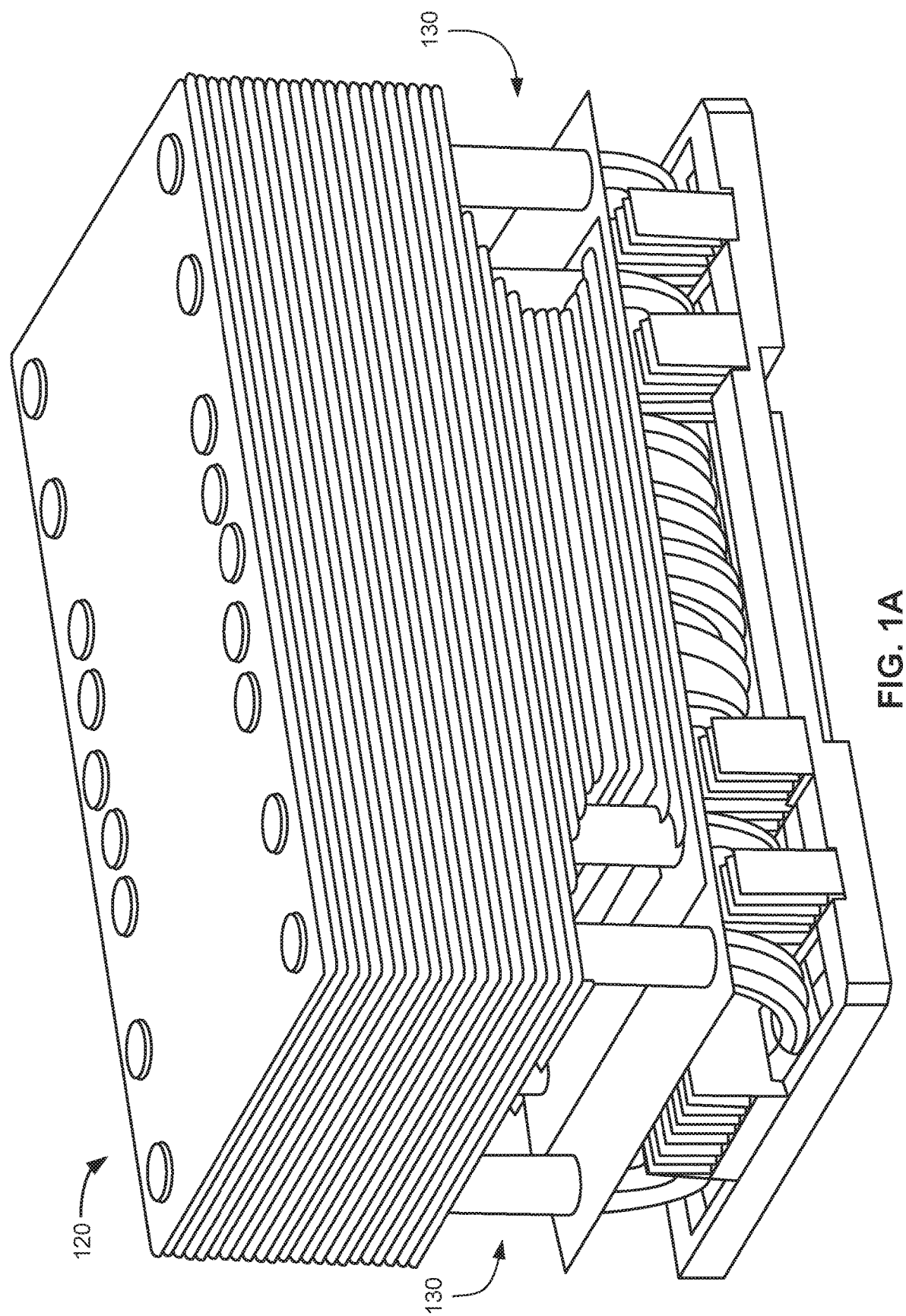
FIG. 1A is a perspective view of a heat exchanger, according to various embodiments of the present invention.
Figure 1B:
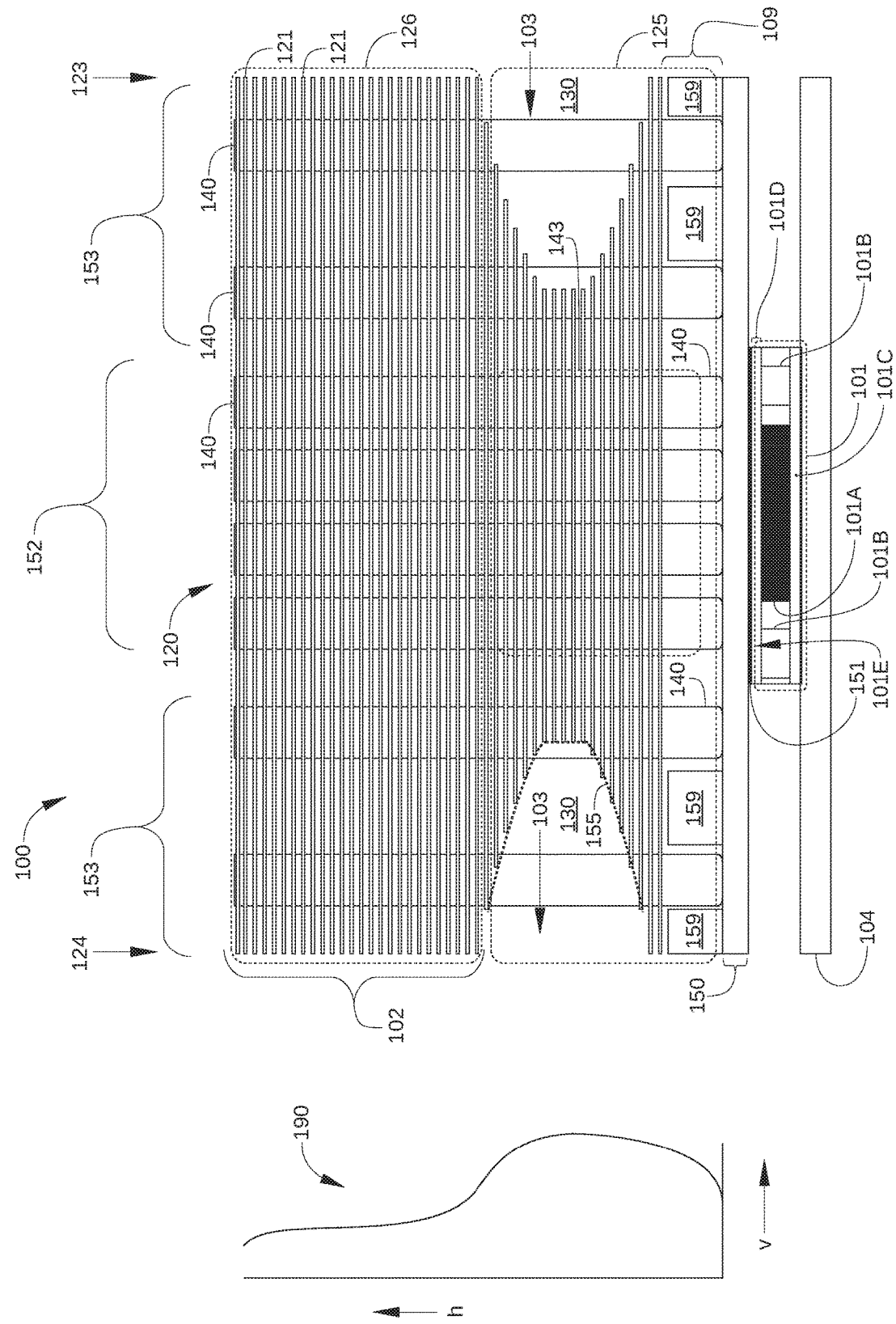
FIG. 1B is a side view of the heat exchanger of FIG. 1A, according to various embodiments of the present invention.

FIG. 1A is a perspective view of a heat exchanger 100 according to various embodiments of the present invention. FIG. 1B is a side view of heat exchanger 100, according to various embodiments of the present invention. Heat exchanger 100 is a heat exchanger for an integrated circuit (IC) 101 and includes an integrated heat sink 120 and a low pressure-drop air plenum 130. Together, heat exchanger 100 and IC 101 form an electronic device that can be mounted on a printed circuit board (PCB) 104. In the embodiments, heat sink 120 includes one or more heat pipes 140 thermally coupled to IC 101 and a plurality of cooling fins 121 attached to heat pipes 140.

In some embodiments, IC 101 includes a single microchip, such as a graphics processing unit (GPU) or centralprocessing unit (CPU). Alternatively, in some embodiments IC 101 includes multiple microchips, such as a processor die 101A and one or more stacks 101B of memory dies that are all mounted on a common packaging substrate 101C. In such embodiments, packaging substrate 101C can be configured for mounting IC 101 onto PCB 104, for example via solder balls (not shown). In addition, in such embodiments, IC 101 may include a package lid 101D, which protects processor die 101A and the one or more stacks 101B of memory dies from physical damage, but also increases thermal resistance associated with the packaging of IC 101. Further, in some multi-microchip embodiments, IC 101 can include other configurations of chips, such as a system-on-chip (SoC) configuration.

Figure 2:
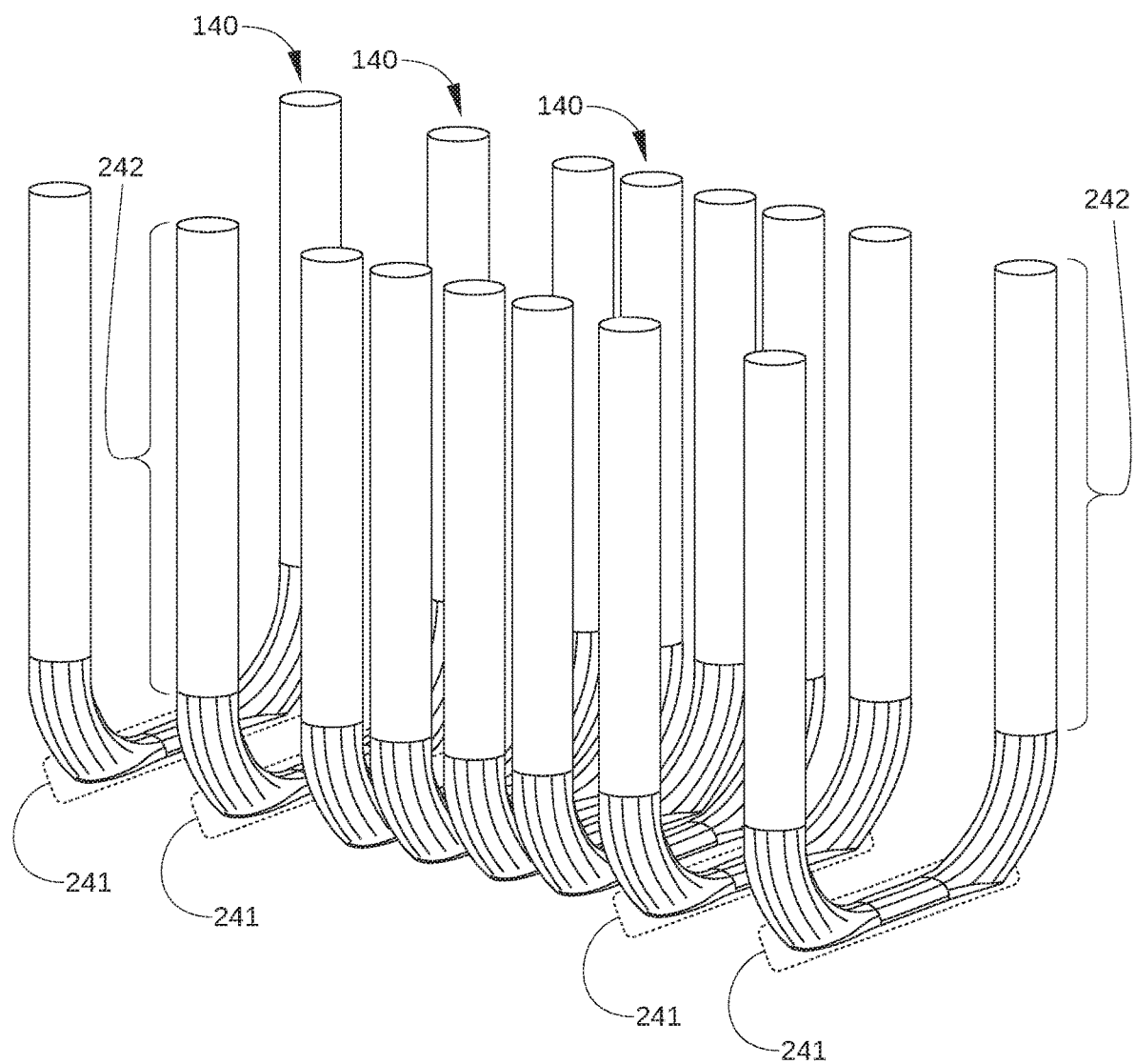
FIG. 2 is a perspective view of the array of heat pipes of FIGS. 1A and 1B, according to various embodiments of the present invention.

Heat pipes 140 are sealed vessels, such as copper tubes, that include an evaporative working fluid (not shown), such as water or alcohol. One embodiment of heat pipes 140 is illustrated in FIG. 2. FIG. 2 is a perspective view of an array of multiple heat pipes 140, according to various embodiments of the present invention. Heat pipes 140 efficiently transfer heat, through a combination of evaporation and condensation, from IC 101 to cooling fins 121 (not shown for clarity) and on to cooling air that passes over cooling fins 121. More specifically, in heat pipes 140, evaporation of the working fluid into a vapor takes place in an evaporator portion 241 of each heat pipe 140, while condensation of the working fluid takes place in one or more condenser portions 242. Each evaporator portion 241 is coupled to a surface from which thermal energy is to be removed, and each condenser portion 242 extends away from the surface from which the thermal energy is to be removed. In the embodiment illustrated in FIG. 2, each heat pipe 140 includes two condenser portions 242, but in other embodiments, each heat pipe 140 can include more than or fewer than two condenser portions 242. Condensed working fluid from condenser portions 242 flows to a corresponding evaporator portion 241, where thermal energy from IC 101 is absorbed and the working fluid vaporizes. The vapor then moves to condenser portions 242 and condenses in the condenser portion 242, releasing latent heat. In some embodiments, each heat pipe 140 also includes a wicking structure or material (not shown) on some or all inner surfaces, to facilitate the return of condensed cooling liquid to the evaporator portion 241 of the heat pipe 140.

Returning to FIGS. 1A and 1B, in the embodiment illustrated, heat pipes 140 are mounted on a metallic plate 150, such as a copper or aluminum plate, that is thermally coupled to IC 101. In such embodiments, metallic plate 150 can be thermally coupled to a major surface 101E of IC 101 via a thermal interface material (TIM) 151, for example a highly thermally conductive paste. Metallic plate 150 spreads heat over a surface area that is greater than that of IC 101. As a result, a larger number of heat pipes 140 can be thermally coupled to IC 101 on metallic plate 150 than when directly attached to IC 101. In some embodiments, a high density of heat pipes 140 is mounted on metallic plate 150 in a high-density heat-pipe area 152 and a low density of heat pipes 140 is mounted to metallic plate 150 in a low-density heat-pipe area 153. Thus, in such embodiments, a portion of metallic plate 150 that is closest to IC 101, and therefore is at the highest temperature during operation of IC 101, has a higher density of heat pipes 140 coupled thereto. By contrast, lower-temperature portions of metallic plate 150, such as low-density heat-pipe area 153, has a lower density of heat pipes 140 coupled thereto.

Cooling fins 121 can be any material that conducts heat efficiently, such as copper or aluminum. Cooing fins 121 are attached along condenser portions 242 of heat pipes 140, and are oriented to allow cooling air to flow in an airflow direction 103 between cooling fins 121 and past condenser portions 242. As shown, cooling fins 121 form one or more low pressure-drop plenums 130 and a high-pressure-drop path 102. The one or more low pressure-drop plenums 130 form a path for cooling air flowing proximate to evaporator portions 241 and high-pressure-drop path 102 is for cooling air flowing distal to evaporator portions 241 of heat pipes 140. Low pressure-drop plenum 130 causes higher velocity, lower temperature cooling air to flow over portions of condenser portions 242 that are closer to IC 101, while high-pressure-drop path 102 causes lower velocity, higher temperature cooling air to flow over portions of condenser portions 242 that are distal to IC 101. Thus, portions of heat pipes 140 closest to IC 101, which are most able to affect the temperature of IC 101, are exposed to the higher velocity, lower temperature cooling air. For example, lower portions 143 of heat pipes 140 disposed in high-density heat-pipe area 152 are exposed to such higher velocity, lower temperature cooling air, as illustrated by a velocity profile 190 included in FIG. 1A.

Velocity profile 190 graphically illustrates the velocity of cooling air (or other cooling fluid) passing through cooling fins 121 as a function of height h above metallic plate 150. The higher pressure drop generated by cooling air flowing through cooling fins 121 via high-pressure-drop path 102 causes the cooling air to flow through cooling fins 121 at a lower velocity than via low pressure-drop air plenum 130. That is, when cooling air flows through cooling fins 121, the reduced length of cooling fins 121 in a low pressure-drop region 125 corresponding to low pressure-drop air plenum 130 results in less pressure drop being generated at a specific velocity than in an adjacent high-pressure drop region 126 (corresponding to high-pressure-drop path 102) at the specific velocity. Consequently, the velocity of the cooling air flowing in low pressure-drop region 125 is significantly higher than in high-pressure drop region 126. As a result of the higher velocity cooling air flowing across the lower portions of heat pipes 140 within low pressure-drop region 125, the highest temperature portions of heat pipes 140 are able to transfer more heat to the cooling air, and heat sink 120 can more effectively transport heat away from IC 101 than conventional heat sinks.

In addition, the cooling air flowing through low pressure-drop air plenum 130 and across the lower portions of heat pipes 140 (within low pressure-drop region 125) is not pre-heated by passing along cooling fins 121 in low-density heat-pipe area 153. Instead, there are few or no cooling fins 121 in low-density heat-pipe area 153 proximate lower portions 143 of heat pipes 140 in high-density heat-pipe area 152. Therefore, little or no heat is transferred to cooling air prior to flowing across lower portions 143. As a result of the cooling air flowing across lower portions 143 not being pre-heated by passing along cooling fins 121, more heat can be transferred from the highest temperature portions of heat pipes 140 (i.e., lower portions 143) to the cooling air, and heat sink 120 can more effectively transport heat away from IC 101 than conventional heat sinks.

According to various embodiments, low pressure-drop air plenum 130 is formed by the termination of a portion of cooling fins 121 prior to an edge region 123 or edge region 124 of heat sink 120. Thus, the portion of cooling fins 121 that terminate prior to edge region 123 and/or 124 have a shorter length in airflow direction 103 than cooling fins that form high-pressure-drop path 102 and extend from edge region 123 to edge region 124. For example, in some embodiments, some or all of the cooling fins 121 in the portion of cooling fins 121 forming low pressure-drop air plenum 130 terminate at an interface region between high-density heat-pipe area 152 and low-density heat-pipe area 153. In some embodiments, each of the cooling fins 121 forming low pressure-drop air plenum 130 terminate at different lengths that correspond to a termination profile 155. In the embodiment illustrated in FIGS. 1A and 1B, termination profile 155 is depicted as a parabolic function for the length of certain cooling fins 121. In other embodiments, termination profile 155 can be a linear function for the length of certain cooling fins 121 that is at or near a minimum for cooling fins 121 closest to IC chip 101. In other embodiments, termination profile 155 can be a step function; that is, in such embodiments, the cooling fins 121 forming low pressure-drop air plenum 130 have the same (shorter) length and the cooling fins 121 forming high-pressure-drop path 102 have the same (longer) length and terminate at edge region 123 and/or edge region 124 of heat sink 120. In yet other embodiments, any other suitable termination profile 155 can be employed to cause higher velocity cooling air to flow through low pressure-drop air plenum 130 and lower velocity cooling air to flow through high-pressure-drop path 102.

In the embodiment illustrated in FIGS. 1A and 1B, low pressure-drop air plenum 130 includes a termination profile 155 at edge region 123 and edge region 124. In other embodiments, low pressure-drop air plenum 130 is formed at either edge region 123 or edge region 124.

Base Plate Cooling Fins

In some embodiments, condenser portions 242 of heat pipes 140 include one or more straight segments that extend away from IC 101 and metallic plate 150. In such embodiments, condenser portions 242 may also include one or more curved segments that connect the straight segments of condenser portions 242 with corresponding evaporator portions 241. In such embodiments, attachment of cooling fins 121 to heat pipes 140 along such curved portions is generally impracticable. As a result, heat sink 120 can include an airflow region 109 that is free of cooling fins 121 and is disposed between metallic plate 150 and low pressure-drop air plenum 130. As shown, airflow region 109 encompasses the curved portions of heat pipes 140 that connect the straight segments of condenser portions 242 with corresponding evaporator portions 241.

Figure 3:
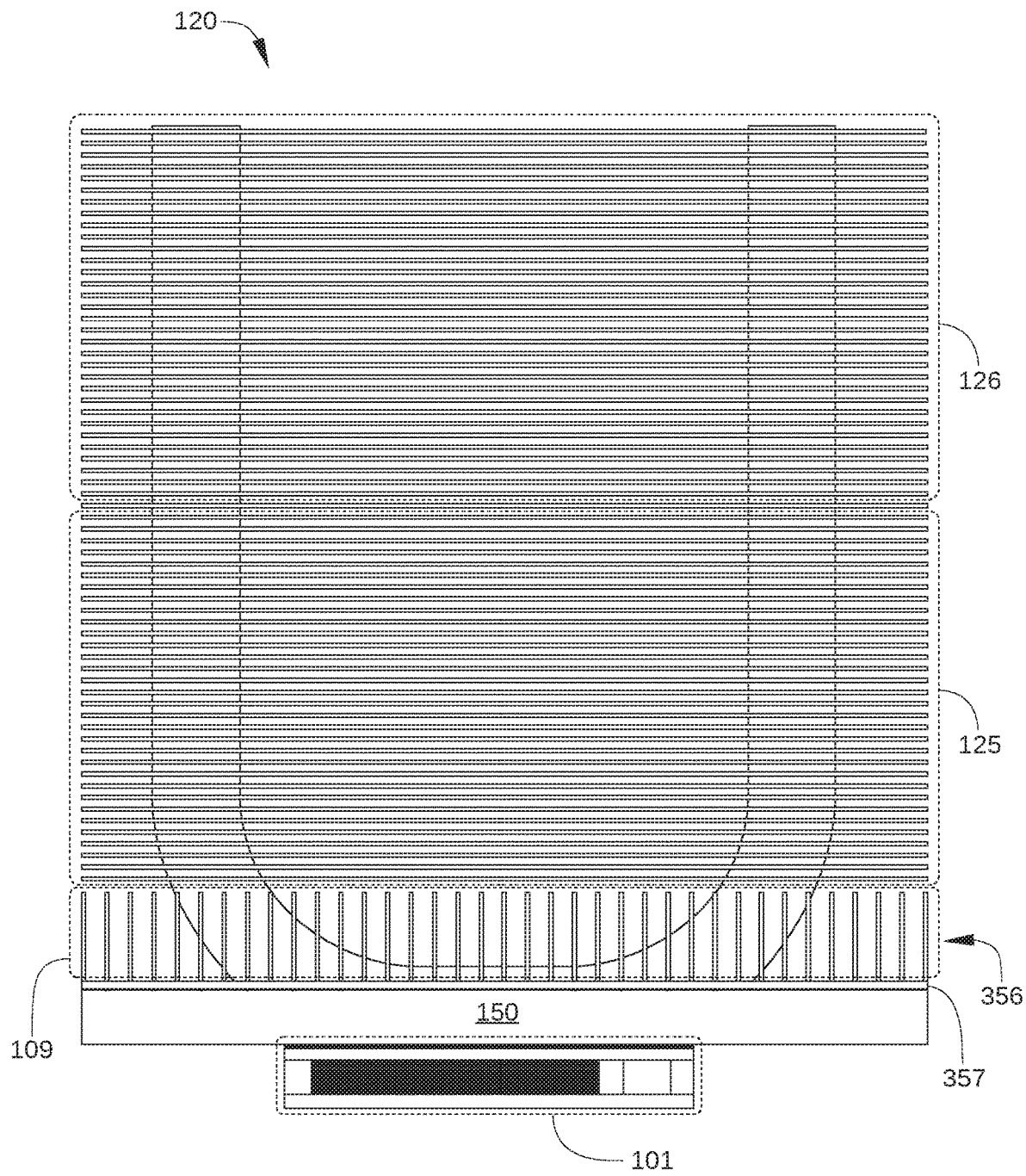
FIG. 3 is an end view of the heat sink of FIGS. 1A and 1B, according to various embodiments of the present invention.

According to some embodiments, one or more sets of plate-mounted cooling fins are attached to metallic plate 150 and extend away from metallic plate 150 and into airflow region 109. Such plate-mounted cooling fins effectively add more surface area to metallic plate 150, further increasing how effectively heat sink 120 can transport thermal energy away from IC 101. FIG. 3 is an end view of heat sink 120, IC 101, and plate-mounted cooling fins 356, according to various embodiments of the present invention. The view illustrated in FIG. 3 is looking in airflow direction 103. As shown, plate-mounted cooling fins 356 extend from metallic plate 150 into airflow region 109. Thus, in such an embodiment, in addition to low pressure-drop region 125 and high-pressure drop region 126, cooling fins are also present in airflow region 109. As a result, the heat removal efficiency of heat sink 120 is increased. In some embodiments, plate-mounted cooling fins 356 are attached to a mounting plate 357 that is in turn coupled, soldered, or otherwise attached to metallic plate 150.

Figure 4:
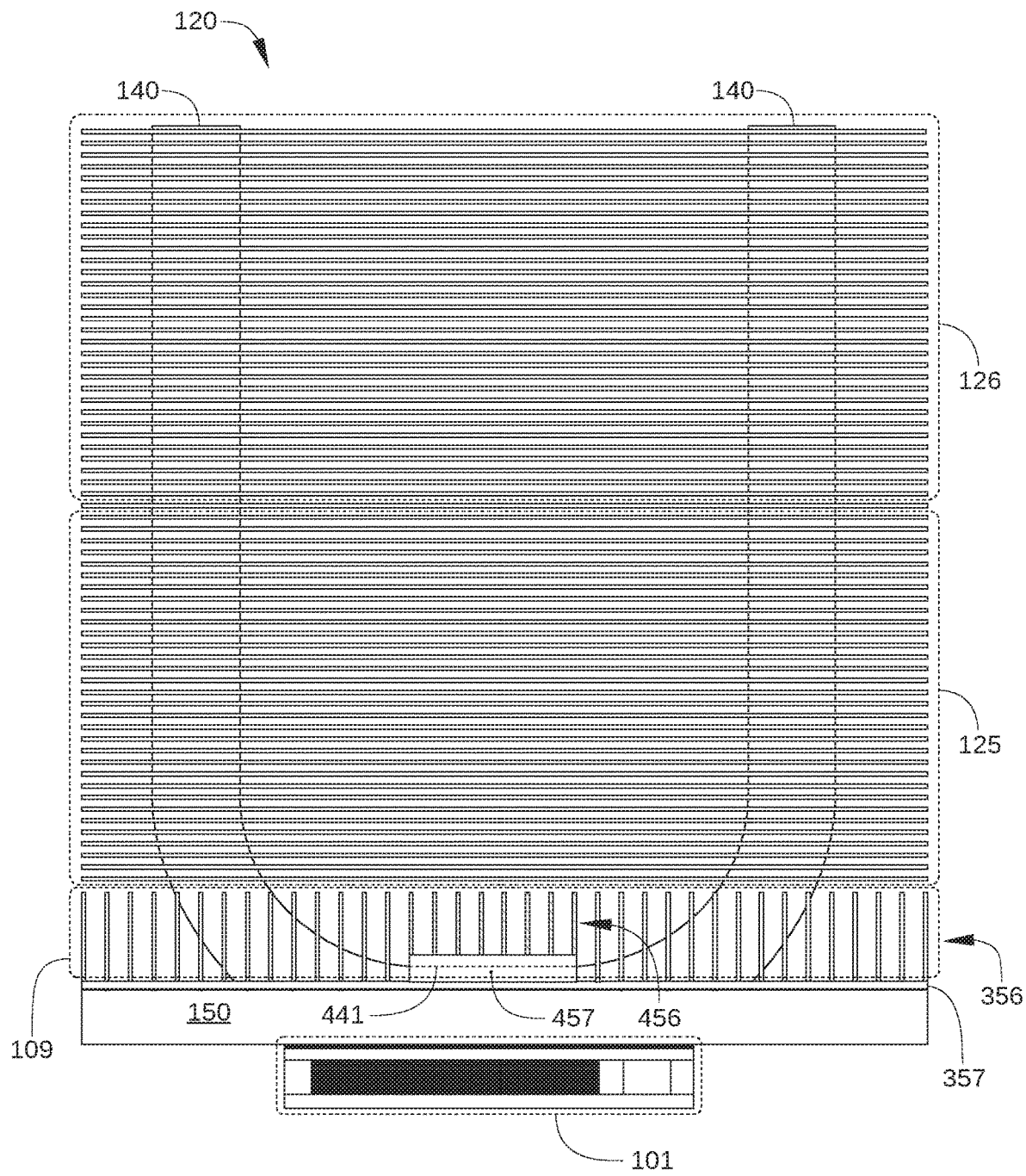
FIG. 4 is an end view of a heat sink, an integrated circuit (IC), and heat pipe-mounted cooling fins, according to various embodiments of the present invention.

Alternatively or additionally, in some embodiments, cooling fins extending into airflow region 109 are mounted on or otherwise thermally coupled to a surface of one or more of heat pipes 140. One such embodiment is illustrated in FIG. 4. FIG. 4 is an end view of heat sink 120, IC 101, and heat pipe-mounted cooling fins 456, according to various embodiments of the present invention. The view illustrated in FIG. 4 is looking in airflow direction 103. As shown, heat pipe-mounted cooling fins 456 (cross-hatched for clarity) extend into airflow region 109 and transfer heat from a surface 441 (dashed line) of one or more of heat pipes 140, thereby extending heat exchanging surfaces into airflow region 109. In some embodiments, heat pipe-mounted cooling fins 456 are attached to a mounting plate 457 that is in turn coupled, soldered, or otherwise attached to surface 441 or surface 441 and metallic plate 150. Heat pipe-mounted cooling fins 456 can be disposed in portions of airflow region 109 into which plate-mounted cooling fins 356 cannot be positioned easily, as illustrated in FIG. 5.

Figure 5:
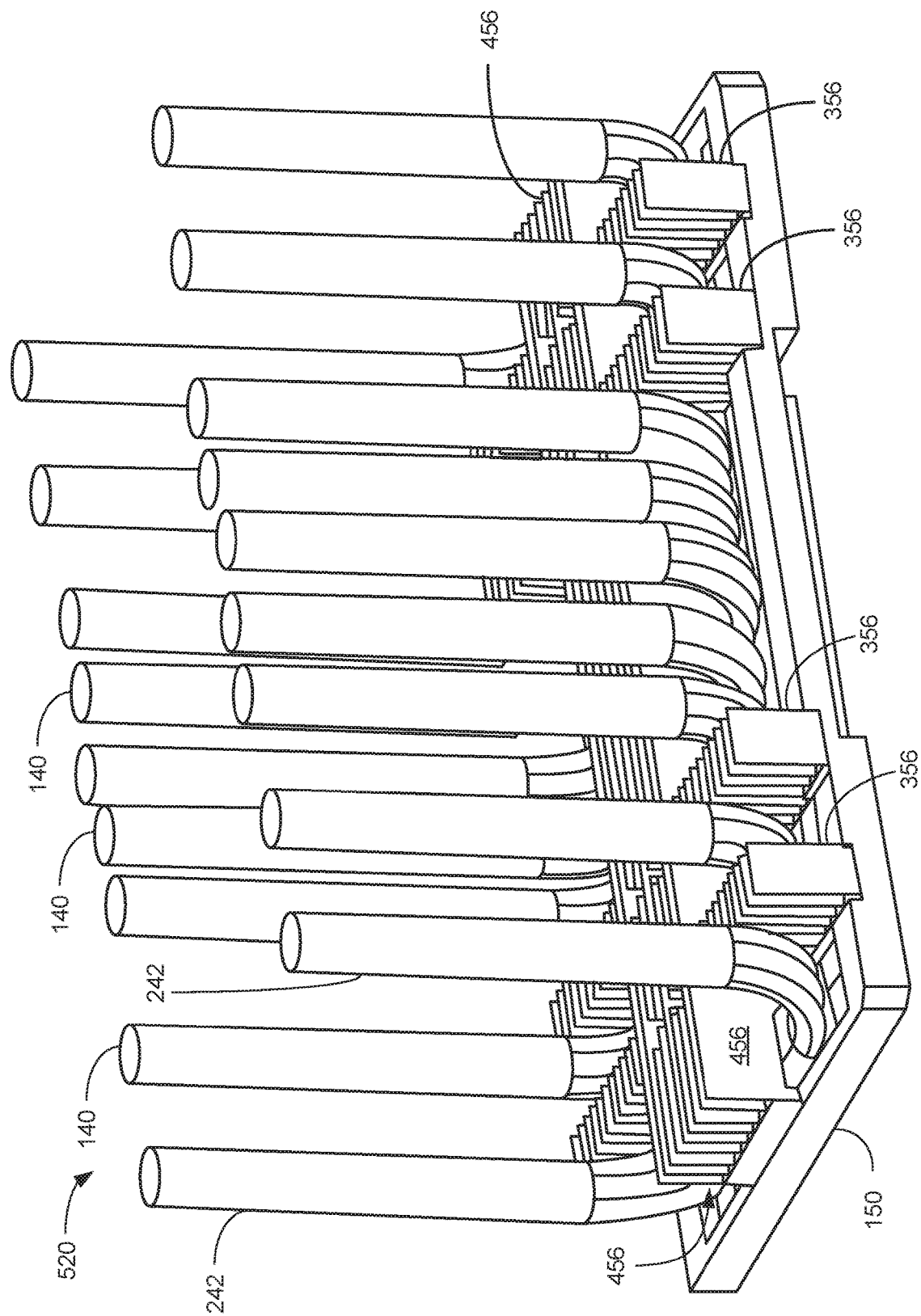
FIG. 5 is a perspective view of a heat sink that includes heat pipes, plate-mounted cooling fins, and heat pipe-mounted cooling fins, according to various embodiments of the present invention.

FIG. 5 is a perspective view of a heat sink 520 that includes heat pipes 140, plate-mounted cooling fins 356, and heat pipe-mounted cooling fins 456, according to various embodiments of the present invention. In FIG. 5, cooling fins 121 are omitted for clarity. As shown, heat pipe-mounted cooling fins 456 can be positioned between the two condenser portions 242 of each heat pipe 140, thereby increasing the heat removal efficiency of heat sink 520.

Base Plate Heat Pipes

In some embodiments, a heat sink can include a set of one or more heat pipes configured to transport thermal energy outward along a metallic plate coupled to an IC. As a result, portions of the metallic plate that are distal to the IC are increased in temperature, further enhancing the heat removal efficiency of the heat sink. One such embodiment is illustrated in FIGS. 6A and 6B.

Figure 6A:
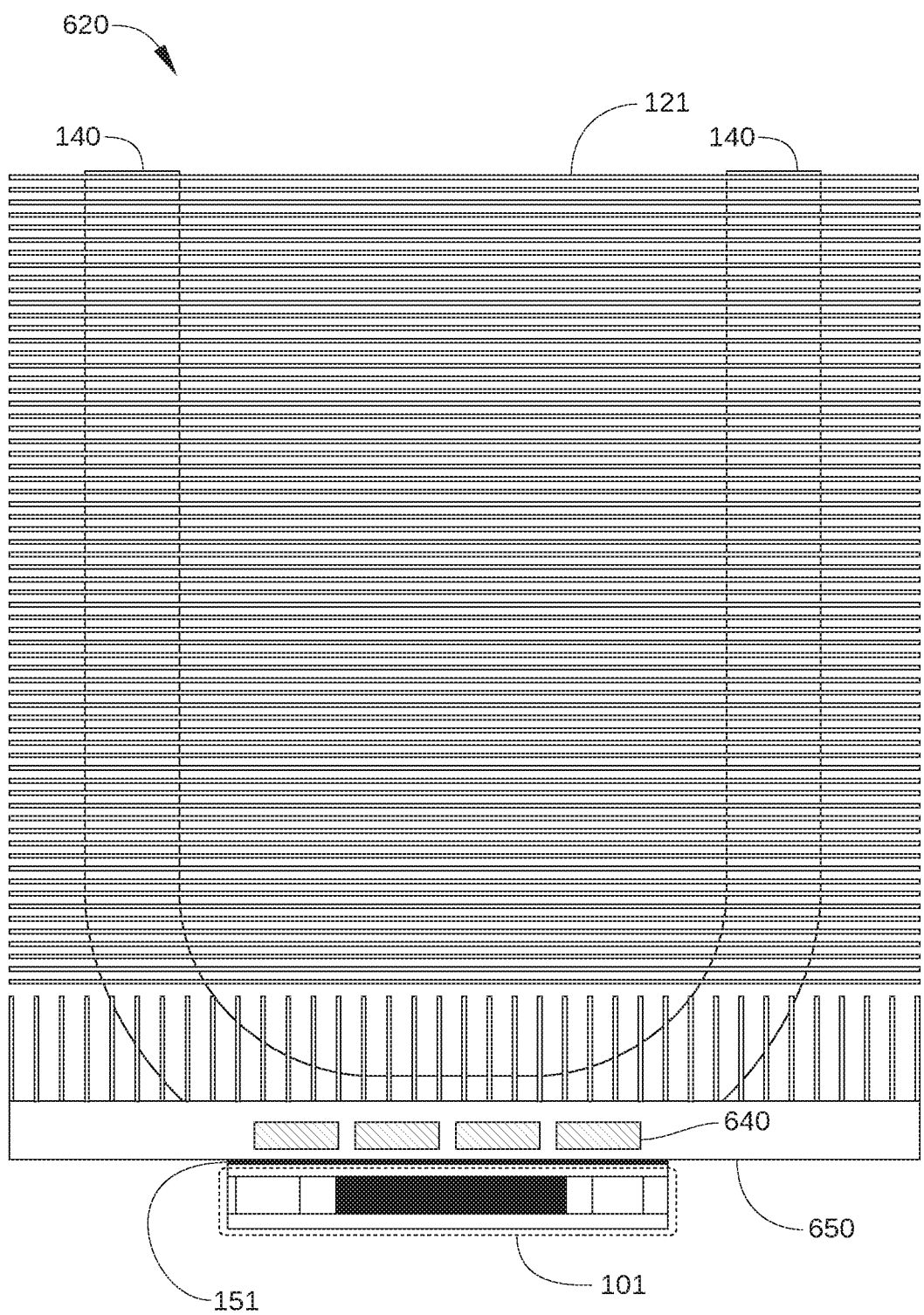
FIG. 6A is a schematic end view of a heat, according to various embodiments of the present invention.
Figure 6B:
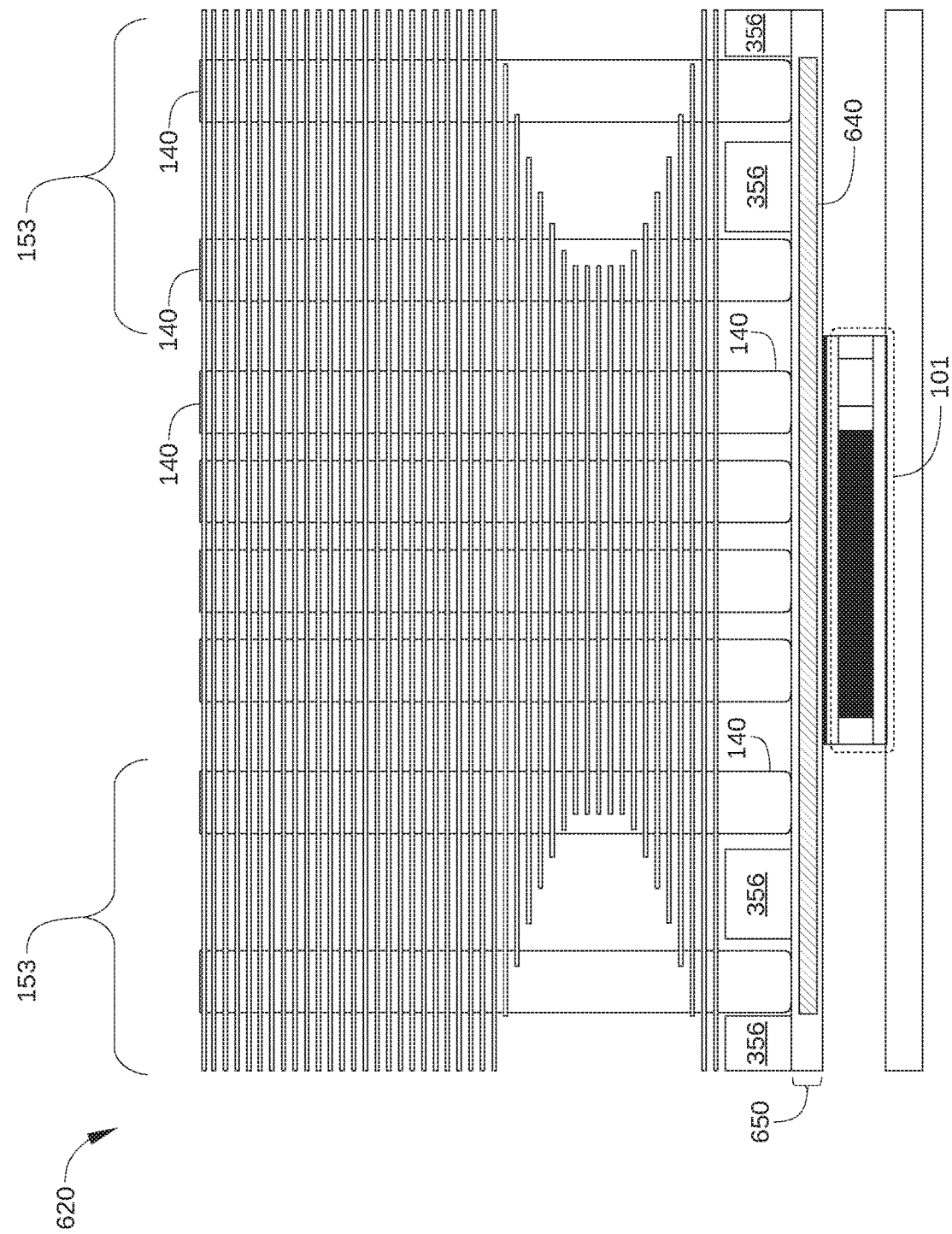
FIG. 6B is a schematic side view of the heat sink of FIG. 6A, according to various embodiments of the present invention.

FIG. 6A is a schematic end view of a heat sink 620, according to a various embodiments of the present invention. The view of heat sink 620 in FIG. 6A is taken in airflow direction 103, i.e., airflow direction 103 is into the page. FIG. 6B is a schematic side view of heat sink 620, according to a various embodiments of the present invention. In the embodiment illustrated in FIGS. 6A and 6B, heat sink 620 includes heat pipes 640 for transporting thermal energy away from IC 101 and across a base plate 650 of heat sink 620. FIG. 6B also shows low pressure-drop plenum 130, heat pipes 140, and plate-mounted cooling fins 356. Heat pipes 640 are formed within and/or on a surface of metallic plate 650, and increase the heat removal effectiveness heat pipes 140 that are coupled to metallic plate 650 in low-density heat-pipe area 153. Specifically, heat pipes 640 increase the heat removal effectiveness of such heat pipes 140 by increasing the temperature of the portions of metallic plate 650 in low-density heat-pipe area 153 with thermal energy transferred from IC 101.

In some embodiments, heat pipes that transport thermal energy away from an integrated circuit across a base plate of the heat sink are coupled to a surface of the base plate. One such embodiment is illustrated in FIGS. 7, 8, and 9.

Figure 7:
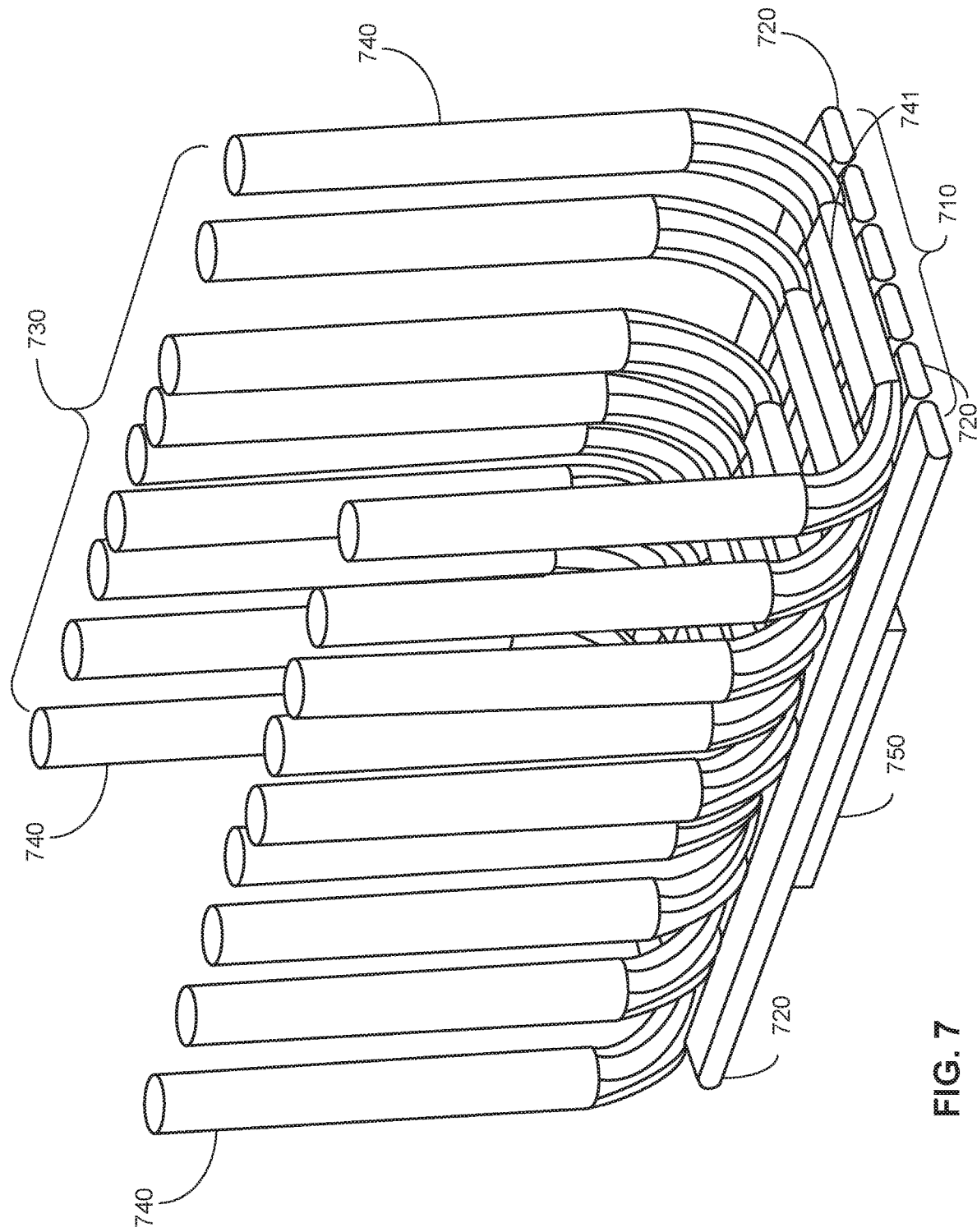
FIG. 7 is a perspective view of a first array of heat pipes coupled to a surface of a base plate and a second array of heat pipes coupled to the heat pipes of first array, according to various embodiments of the present invention.

FIG. 7 is a perspective view of a first array 710 of heat pipes 720 coupled to a surface of a base plate 750 and a second array 730 of heat pipes 740 coupled to the heat pipes 720 of first array 710, according to various embodiments of the present invention. For clarity, cooling fins 121, which are typically coupled to heat pipes 740, are omitted in FIG. 7. Heat pipes 720 of first array 710 transport thermal energy away from an integrated circuit (not shown in FIG. 7) and to the heat pipes 720 of first array 710. To that end, some or all of heat pipes 720 are thermally and mechanically coupled to an evaporator portion 741 of each heat pipe 740 of second array 730. As a result, heat transported away from base plate by heat pipes 720 heats evaporator portions 741 of heat pipes 740.

Heat pipes 740 can be coupled to heat pipes 720 via soldering or any other technically feasible technique. In some embodiments, in addition to solder between heat pipes 740 and heat pipes 720 for mechanically and thermally coupling heat pipes 740 to heat pipes 720, a solder fill material (not shown) can be employed to fill air gaps between heat pipes 720, air gaps between heat pipes 740, and air gaps between first array 710 and second array 730. In such embodiments, first array 710 and second array 730 are more robustly couple together and heat transfer therebetween is enhanced.

Figure 8:
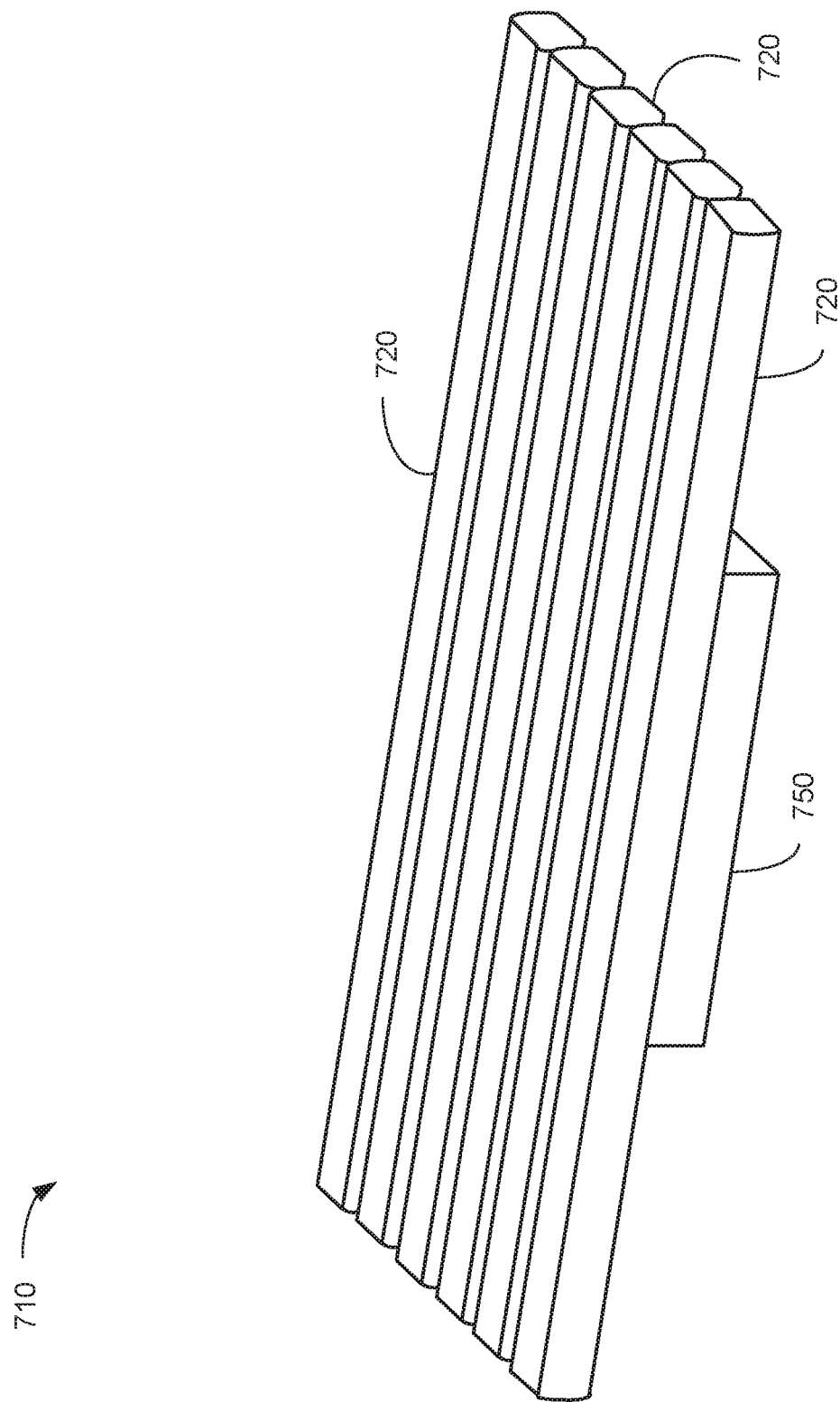
FIG. 8 is a perspective view of the first array of heat pipes in FIG. 7 coupled to base plate, according to various embodiments of the present invention.
Figure 9:
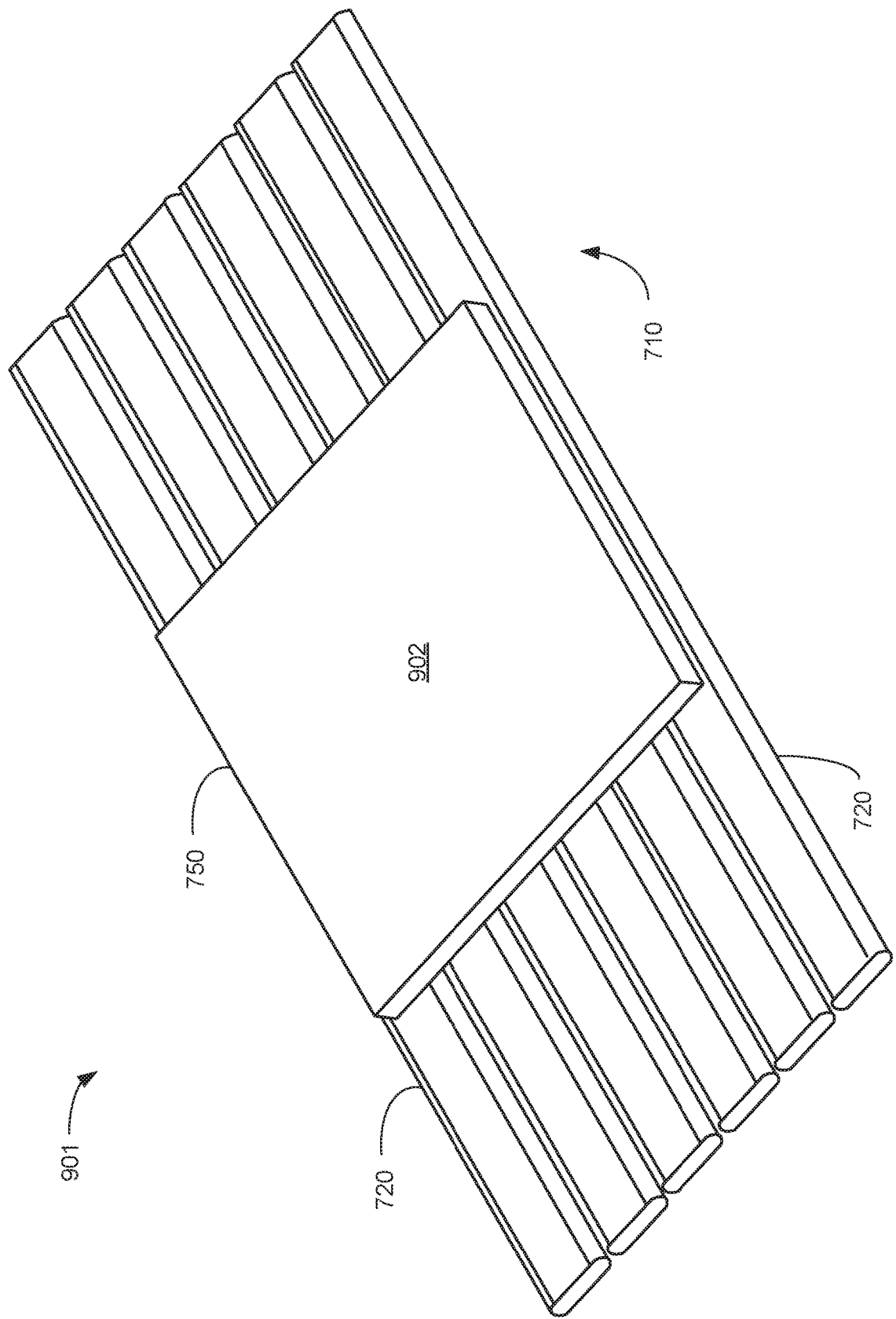
FIG. 9 is a bottom perspective view of the first array of heat pipes in FIG. 7, according to various embodiments of the present invention.

FIG. 8 is a perspective view of first array 710 of heat pipes 720 coupled to base plate 750, according to various embodiments of the present invention. For clarity, second array 730 is omitted in FIG. 8. As shown, each of heat pipes 720 of first array 710 is coupled to a surface of base plate 750. In some embodiments, heat pipes 720 are coupled to the surface of base plate 750 via a soldering process. In such embodiments, additional solder material (not shown) can be employed to fill air gaps between heat pipes 720 and base plate 750, thereby enhancing thermal transport from base plate 750 and heat pipes 720. In other embodiments, any other technically feasible technique can be employed to mechanically and thermally couple heat pipes 720 to base plate 750.

FIG. 9 is a bottom perspective view of first array 710 of heat pipes 720, according to various embodiments of the present invention. As shown, base plate 750 is coupled to heat pipes 720, forming an assembly 901. When first array 710 and base plate 750 are included in a heat sink, such as heat sink 120 of FIGS. 1A and 1B, a surface 902 of base plate 750 is configured to be thermally coupled to an IC (not shown), for example IC 101 in FIGS. 1A and 1B. Thus, assembly 901 is configured to transmit heat generated by the IC through base plate 750 and into heat pipes 720.

In the embodiment illustrated in FIGS. 7, 8, and 9, base plate 750 is configured to be coupled to a middle portion of each of heat pipes 720, rather than along most or all of the length of each heat pipe 720. In such embodiments, assembly 901 can be further configured to mate with a larger base plate that includes a suitably configured opening for base plate 750. An embodiment of one such larger base plate is illustrated in FIG. 10.

Figure 10:
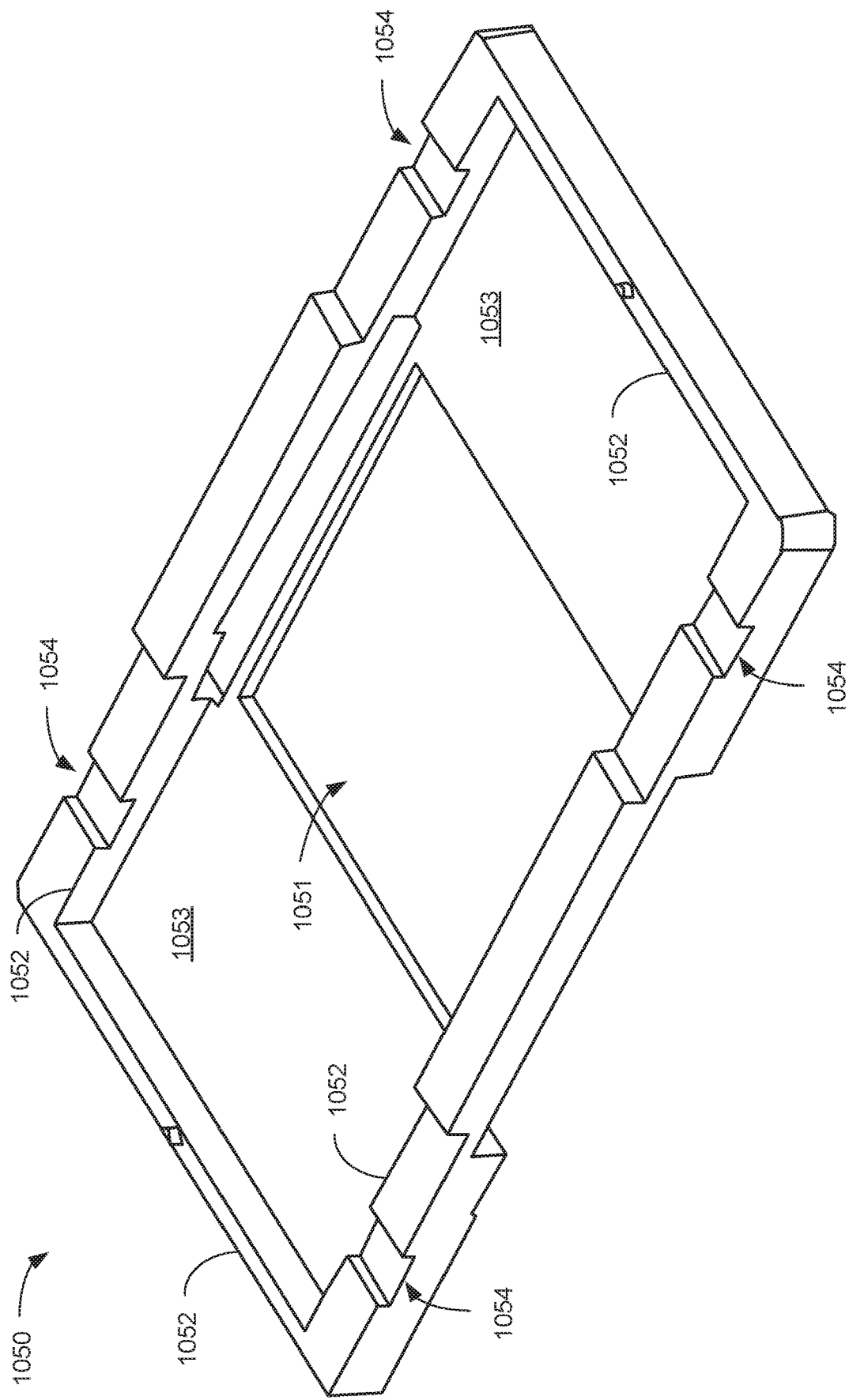
FIG. 10 is a perspective view of a base plate configured to mate with a smaller base plate to which heat pipes are coupled, according to various embodiments of the present invention.

FIG. 10 is a perspective view of a base plate 1050 configured to mate with a smaller base plate to which heat pipes are coupled, according to various embodiments of the present invention. As shown, base plate 1050 includes an opening 1051 that is configured to substantially match the shape of a smaller base plate (e.g., base plate 750 in FIGS. 7, 8, and 9) to which heat pipes 720 are coupled. In addition, in some embodiments, base plate 1050 includes walls 1052, which extend away from a central surface 1053 and are configured to accommodate heat pipes 720 when assembly 901 is coupled to base plate 1050. In some embodiments, walls 1052 are configured to at least partially encircle heat pipes 720 when assembly 901 is coupled to base plate 1050. Thus, in some embodiments, heat pipes 720 can first be coupled to base plate 750 to form assembly 901 of FIG. 9, then assembly 901 can be coupled to base plate 1050 by inserting base plate 750 into opening 1051. Assembly 901 and base plate 1050 can then be mechanically and thermally coupled to each other, for example via a soldering process. In such embodiments, additional solder material can be employed to fill air gaps between heat pipes 720 and walls 1052 and/or air gaps between heat pipes 720 and central surface 1053.

In some embodiments, walls 1052 of base plate 1050 include one or more notches 1054 or other mechanical features configured to accommodate a mounting plate for plate-mounted cooling fins. For example, when plate-mounted cooling fins 356 of FIG. 3 are attached to mounting plate 357, notches 1054 can be configured to accommodate a suitably configured tab or other feature of mounting plate 357.

Figure 11:
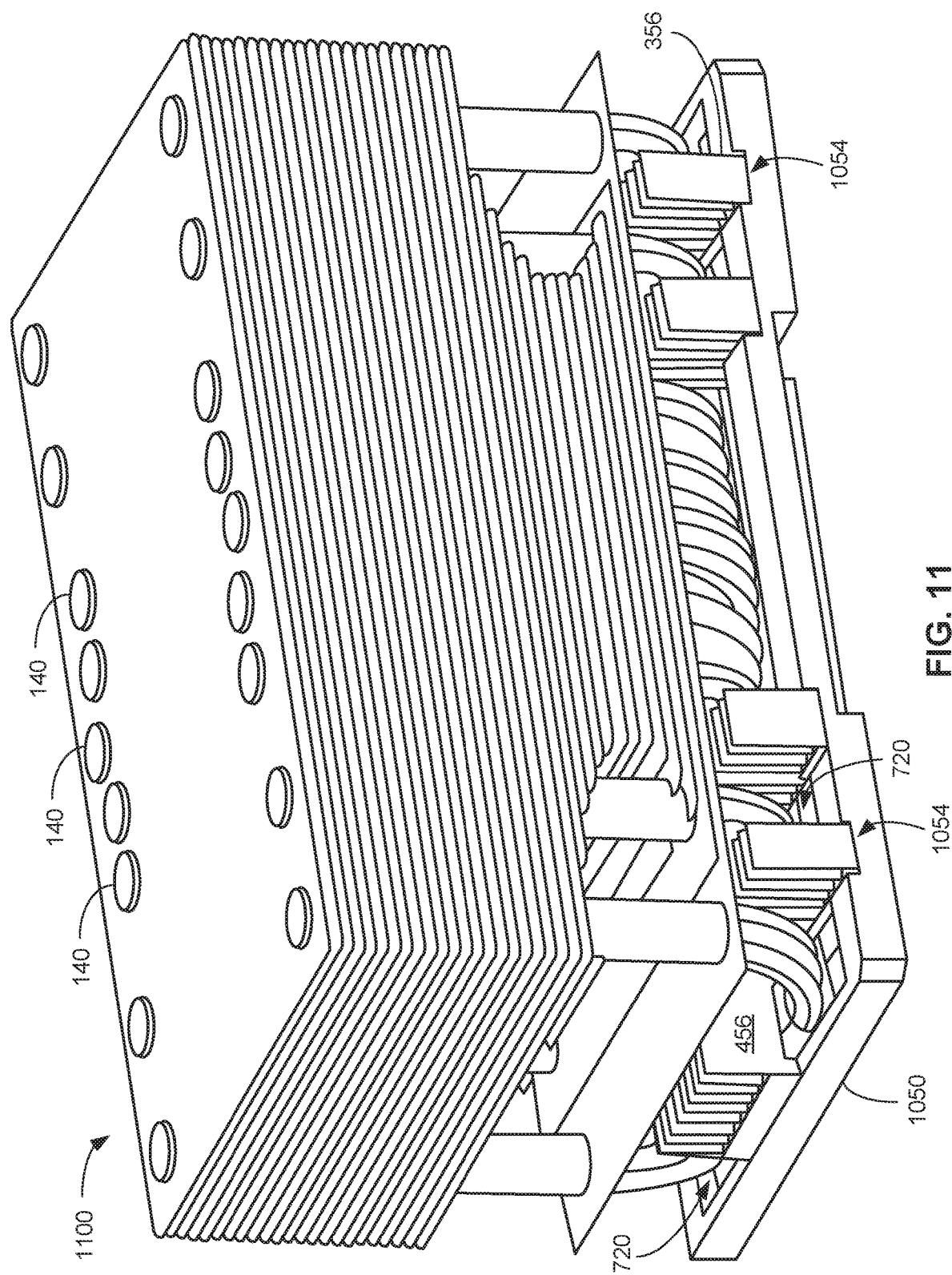
FIG. 11 is a perspective view of a heat exchanger, according to other various embodiments of the present invention.

An embodiment of a heat sink that includes features of the above-described embodiments is illustrated is illustrated in FIG. 11. FIG. 11 is a perspective view of a heat exchanger 1100, according to other various embodiments of the present invention. As shown, heat exchanger 1100 includes base plate 1050 with notches 1054 for accommodating plate-mounted cooling fins 356. Heat exchanger 1100 further includes heat pipe-mounted cooling fins 456 and heat pipes 140 mounted on and coupled to an array of heat pipes 720. Heat pipes 720 are coupled to base plate 750, which is inserted into an opening (not shown) of base plate 1050.

Multiple IC Configuration

Figure 12:
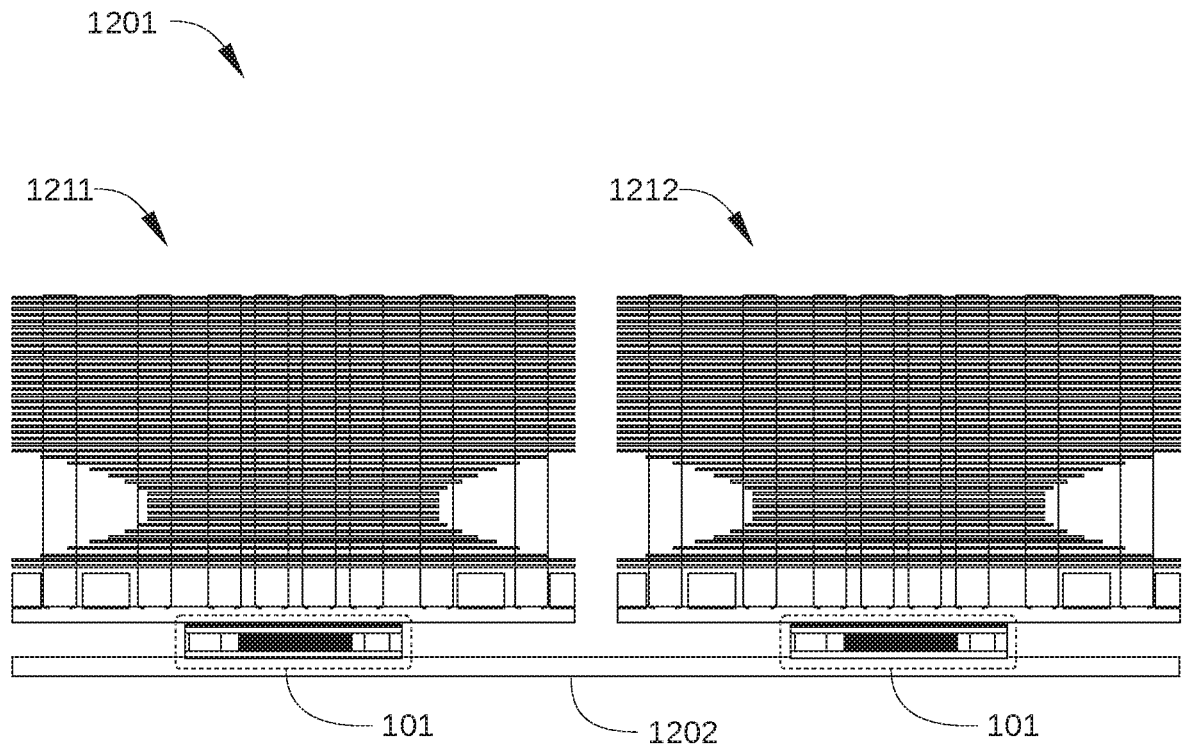
FIG. 12 is a schematic side view of an electronic device that includes multiple heat exchangers and ICs mounted on a single printed circuit board, according to various embodiments of the present invention.

In some embodiments, multiple ICs may be mounted on a single PCB. In such embodiments, multiple heat exchangers can also be mounted on the single PCB. One such embodiment is illustrated in FIG. 12. FIG. 12 is a schematic side view of an electronic device 1201 that includes multiple heat exchangers 1211 and 1212 and multiple ICs 101, all mounted on a single PCB 1202, according to various embodiments of the present invention. In some embodiments, heat exchangers 1211 and 1212 are positioned on PCB 1201 so that cooling air (or any other cooling fluid) may flow sequentially through a first heat exchanger of an electronic device (for example heat exchanger 1211 and a second heat exchanger of the electronic device (for example heat exchanger 1212). That is, heat exchangers 1211 and 1212 are positioned on PCB 1201 so that cooling air can flow through the first heat exchanger and then flow through the second heat exchanger. For example, as shown in FIG. 12, cooling fins coupled to the heat pipes of heat exchanger 1211 are oriented parallel to the cooling fins coupled to the heat pipes of heat exchanger 1212. Thus, sequential flow of a cooling fluid through heat exchangers 1211 and 1212 is facilitated.

Computing Device

In some embodiments, electronic device 1201, which includes multiple ICs and heat exchangers, is included in a larger computing device. One such embodiment is illustrated in FIG. 13.

Figure 13:
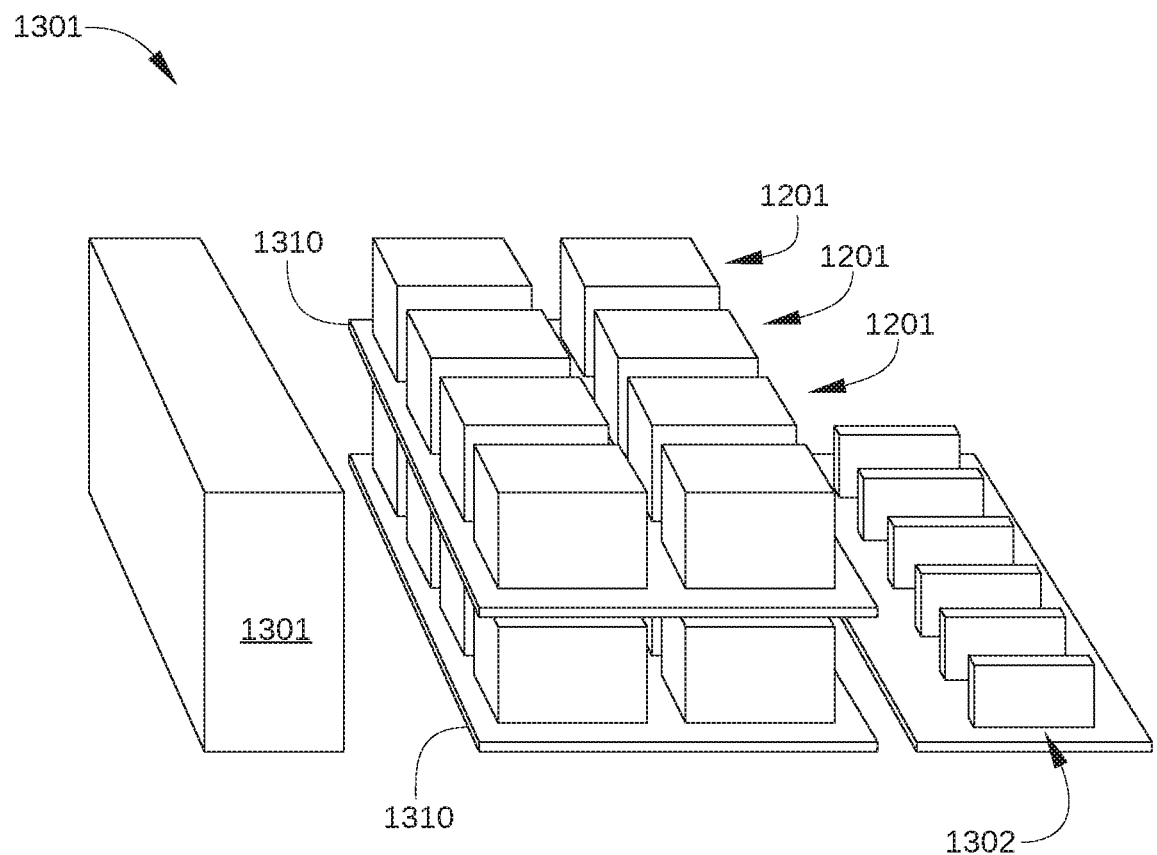
FIG. 13 is a schematic view of a computing device that includes one or more the electronic devices of FIG. 12, according to various embodiments of the present invention.

FIG. 13 is a schematic view of a computing device 1300 that includes one or more electronic devices 1201, according to an embodiment of the invention. Computing device 1300 can be configured for use in high-performance applications, such as in a data center. As such, computing device 1300 includes a plurality of electronic devices 1201. In the embodiment illustrated in FIG. 13, computing device includes multiple trays 1310 of electronic devices 1201. In addition, computing device 1300 includes, in some embodiments, a fan box 1301 with a plurality of fans configured to force cooling air across the heat exchangers included in electronic devices 1201. In some embodiments, computing device 1300 further includes additional ICs, PCBs, and other electronic components 1302 that are cooled by the air forced across the heat exchangers included in electronic devices 1201. While the heat transfer efficiency of the heat exchangers included in electronic devices 1201 is superior to that of conventional heat exchangers, it is noted that the low pressure-drop air plenums 130 included in the heat exchangers of electronic devices 1201 generally have similar or even less pressure drop than conventional heat exchangers.

Alternative Plenum Configuration in Heat Exchanger

In embodiments described above, cooling fins of a heat exchanger are configured to form one or more low pressure-drop plenums that cause higher velocity, lower temperature cooling air to flow over heat pipe condenser portions that are proximate to an IC. Concurrently, a high-pressure-drop path through the cooling fins of the heat exchanger causes lower velocity, higher temperature cooling air to flow over portions of heat pipe condenser portions that are distal to the IC. In some alternative embodiments, the one or more low pressure-drop plenums are formed by a group of the cooling fins having a larger fin pitch than one or more other groups of the cooling fins. One such embodiment is illustrated in FIGS. 14 and 15.

Figure 14:
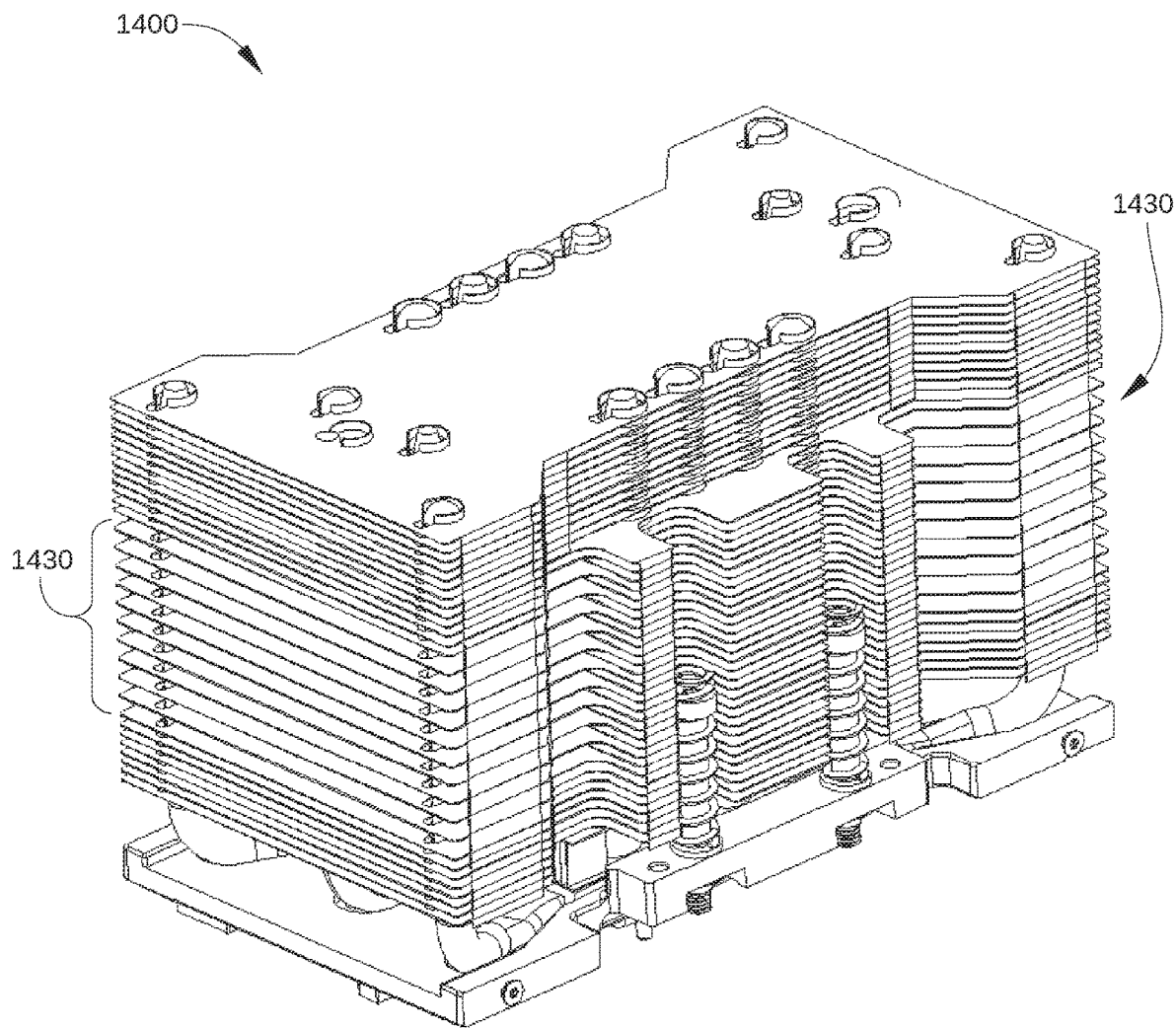
FIG. 14 is a perspective view of a heat exchanger according to various embodiments of the present invention.

FIG. 14 is a perspective view of a heat exchanger 1400 according to various embodiments of the present invention. FIG. 15 is a side view of heat exchanger 1400, according to various embodiments of the present invention. Heat exchanger 1400 is a heat exchanger for IC 101 and includes an integrated heat sink 1420 with a low pressure-drop air plenum 1430.

Heat exchanger 1400 is similar to heat exchanger 100 in FIG. 1, with the exception that low pressure-drop air plenum 1430 is formed by a first group 1525 of cooling fins 121 having a larger fin pitch 1501 than one or more other groups of the cooling fins, such as second group 1526 of cooling fins 121. As shown, second group 1525 is configured with cooling fins 121 that have a fin pitch 1502 that is significantly less than fin pitch 1501. As a result, higher pressure drop is generated by cooling air flowing at a specific velocity through second group 1526 than by cooling air flowing at the same velocity through first group 1525. Consequently, in operation, the velocity of the cooling air flowing through a low pressure-drop region formed by low pressure-drop air plenum 1430 is significantly higher than in the high-pressure drop region formed by second group 1526. In addition, first group 1525 is disposed proximate to IC 101 while second group 1526 is disposed distal to IC 101. As a result of the higher velocity cooling air flowing across the lower portions of heat pipes 140 within low pressure-drop air plenum 1430, the highest temperature portions of heat pipes 140 are able to transfer more heat to the cooling air, and heat sink 1420 can more effectively transport heat away from IC 101 than conventional heat sinks.

Figure 15:
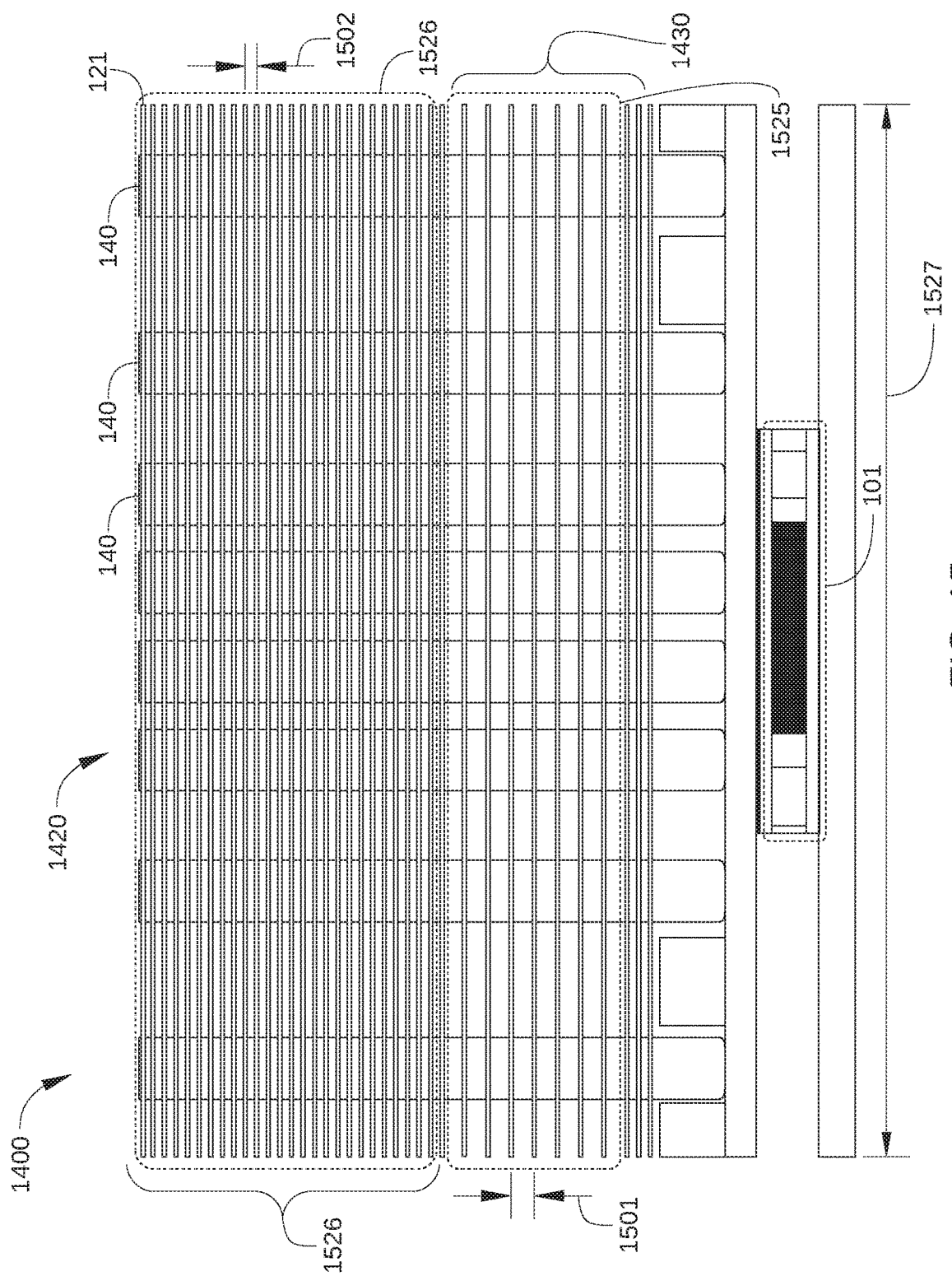
FIG. 15 is a side view of the heat exchanger of FIG. 14, according to various embodiments of the present invention.

In the embodiment illustrated in FIGS. 14 and 15, each cooling fin 121 in first group 1525 and in second group 1526 has a fin length 1527. In other embodiments, cooling fins 121 in first group 1525 have a different fin length than cooling fins 121 in second group 1526. On such embodiment is illustrated in FIG. 16.

Figure 16:
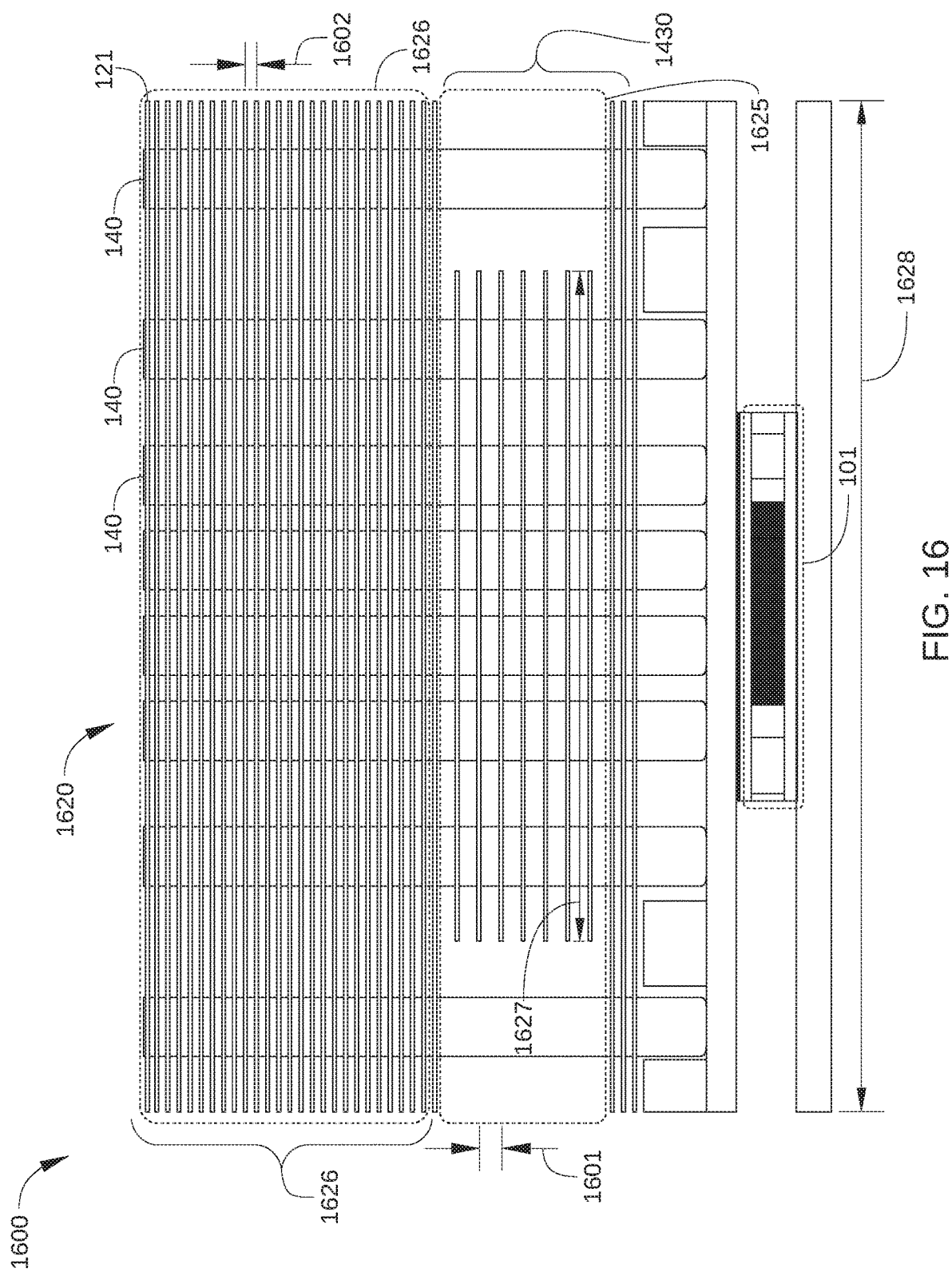
FIG. 16 is a side view of a heat exchanger, according to various embodiments of the present invention.

FIG. 16 is a side view of a heat exchanger 1600, according to various embodiments of the present invention. Heat exchanger 1600 is a heat exchanger for IC 101 and includes an integrated heat sink 1620 with a low pressure-drop air plenum 1630. Heat exchanger 1600 is similar to heat exchanger 1400 in FIGS. 14 and 15, with the exception that low pressure-drop air plenum 1630 is formed by a first group 1625 of cooling fins 121 having a larger fin pitch 1601 and shorter length 1627 than one or more other groups of the cooling fins, such as second group 1626. As shown, second group 1625 is configured with cooling fins 121 that have a fin pitch 1602 that is significantly less than fin pitch 1601 and a fin length 1628 that is significantly greater than length 1627. As a result, higher pressure drop is generated by cooling air flowing at a specific velocity through second group 1625 than by cooling air flowing at the same velocity through first group 1626.

In some embodiments, multiple groups of cooling fins 121 in a heat exchanger have fin lengths that correspond to a termination profile. That is, a first group of cooling fins 121 in the heat exchanger have fin lengths that correspond to a first termination profile and a second group of cooling fins 121 in the heat exchanger have fin lengths that correspond to a second termination profile. One such embodiment is illustrated in FIG. 17.

Figure 17:
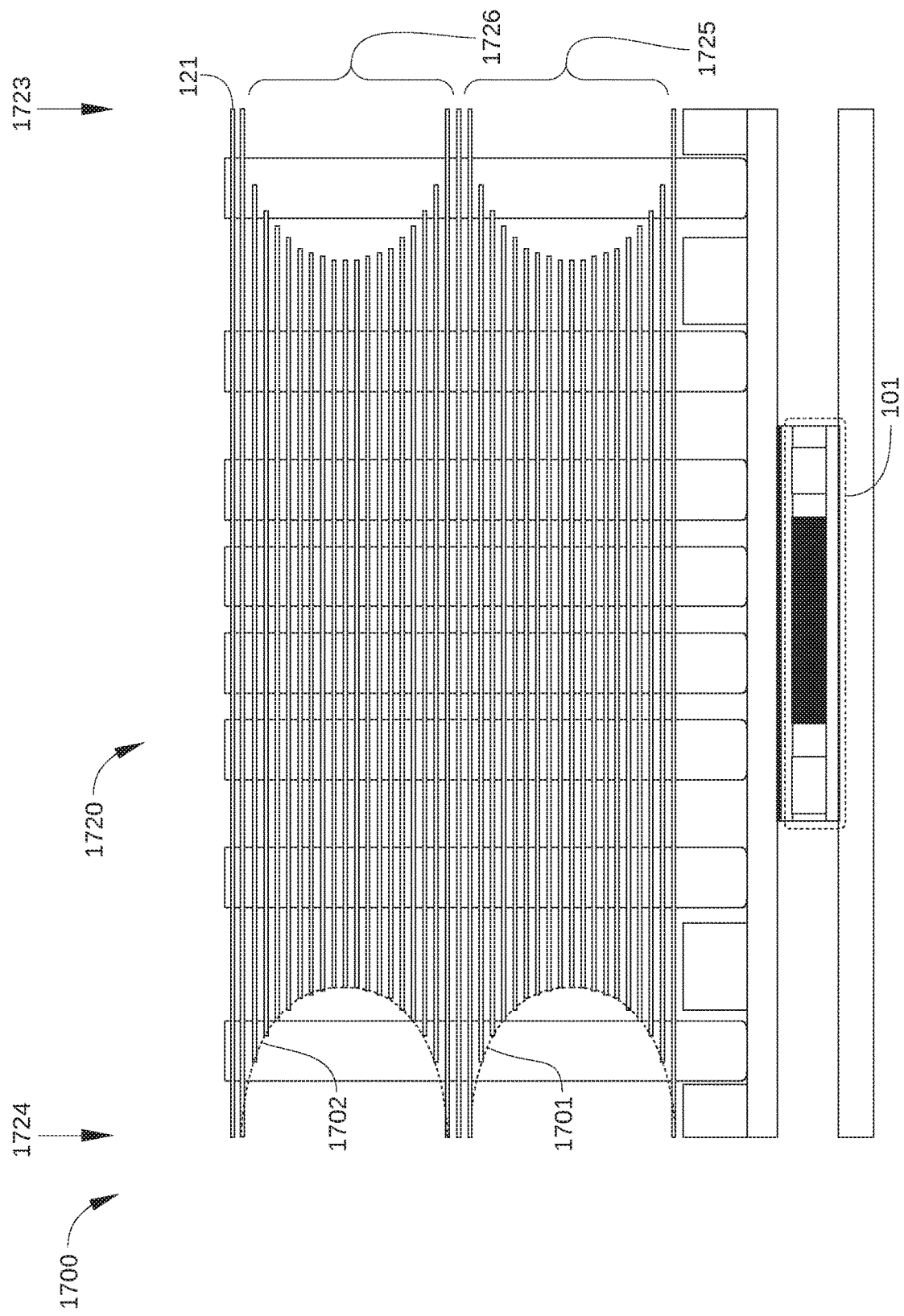
FIG. 17 is a side view of a heat exchanger, according to various embodiments of the present invention.

FIG. 17 is a side view of a heat exchanger 1700, according to various embodiments of the present invention. Heat exchanger 1700 is a heat exchanger for IC 101 and includes an integrated heat sink 1720 with a low pressure-drop air plenum 1730. Heat exchanger 1700 is similar to heat exchanger 1400 in FIGS. 14 and 15, with the exception that heat exchanger 1700 includes two or more groups of cooling fins 121, where the cooling fins 121 of each group have respective lengths that correspond to a particular termination profile. Thus, in the embodiment illustrated in FIG. 17, heat exchanger 1700 includes a first group 1725 of cooling fins 121 that have respective lengths corresponding to a first termination profile 1701 and a second group 1726 of cooling fins 121 that have respective lengths corresponding to a second termination profile 1702. In such embodiments, the configuration of multiple groups of cooling fins 121 that each form a termination profile enables further tuning of the pressure drop and/or cooling fluid velocity associated with each group of fins. That is, a flow rate of a cooling fluid through first group 1725 can be selected relative to a flow rate of the cooling fluid though second group 1726, for example by modifying the morphology of first termination profile 1701 and/or second termination profile 1702.

In the embodiment illustrated in FIG. 17, cooling fins 121 of first group 1725 are formed in first termination profile 1701 on leading edge region 1723 and on a trailing edge region 1724 of heat exchanger 1700. In alternative embodiments, cooling fins 121 of first group 1725 are formed in first termination profile 1701 on either leading edge region 1723 or on trailing edge region 1724 of heat exchanger 1700, but not on both. Alternatively or additionally, cooling fins 121 of second group 1726 are formed in second termination profile 1702 on either leading edge region 1723 or on trailing edge region 1724 of heat exchanger 1700, but not on both.

In the embodiment illustrated in FIG. 17, first termination profile 1701 of first group 1725 is substantially similar to second termination profile 1702 of second group 1726. Alternatively or additionally, in some embodiments, first termination profile 1701 differs significantly from second termination profile 1702 of second group 1726. Examples of such embodiments are illustrated in FIGS. 18A-18C.

Figure 18A:
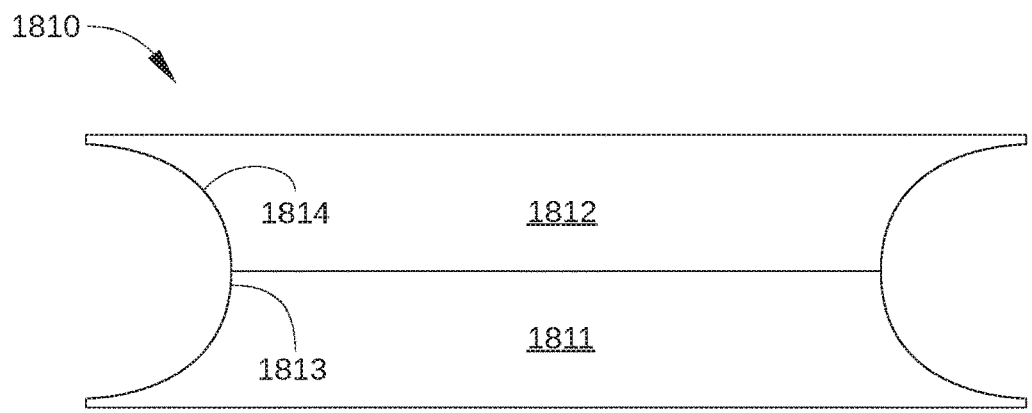
FIG. 18A schematically illustrates a side view of a heat exchanger, according to various embodiments of the present invention.

FIG. 18A schematically illustrates a side view of a heat exchanger 1810, according to various embodiments of the present invention. In FIG. 18A, heat exchanger 1810 includes a first portion 1811 of cooling fins (not shown individually for clarity) that are collectively configured to form a first termination profile 1813. In addition, heat exchanger 1810 includes a second portion 1812 of cooling fins (not shown individually for clarity) that are collectively configured to form a second termination profile 1814. As shown, first termination profile 1813 differs from second termination profile 1814.

Figure 18B:
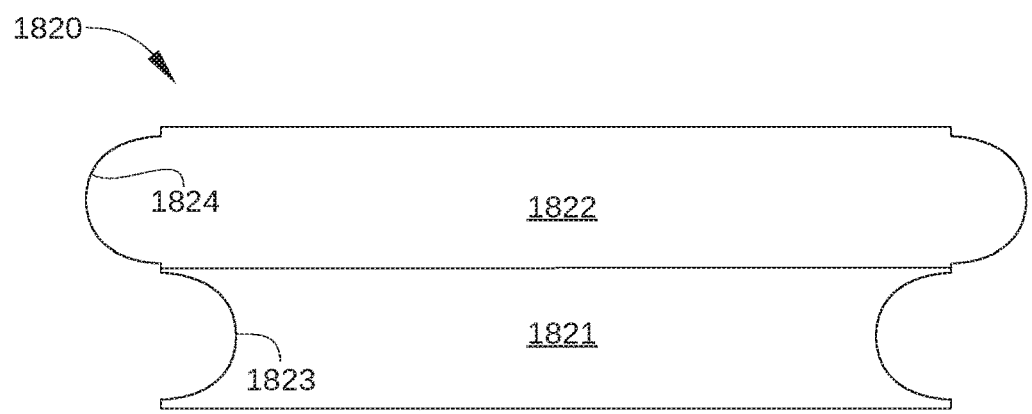
FIG. 18B schematically illustrates a side view of a heat exchanger, according to various embodiments of the present invention.

FIG. 18B schematically illustrates a side view of a heat exchanger 1820, according to various embodiments of the present invention. In FIG. 18B, heat exchanger 1820 includes a first portion 1821 of cooling fins (not shown individually for clarity) that are collectively configured to form a first termination profile 1823 and a second portion 1822 of cooling fins (not shown individually for clarity) that are collectively configured to form a second termination profile 1824. As a consequence of the relative shapes of first termination profile 1823 and second termination profile 1824, higher pressure drop across heat exchanger 1820 is generated by cooling air flowing at a specific velocity through second portion 1822 than by cooling air flowing at the same velocity through first portion 1821. As a result, during operation more cooling air tends to flows through first portion 1821 and at a higher velocity than through second portion 1822.

Figure 18C:
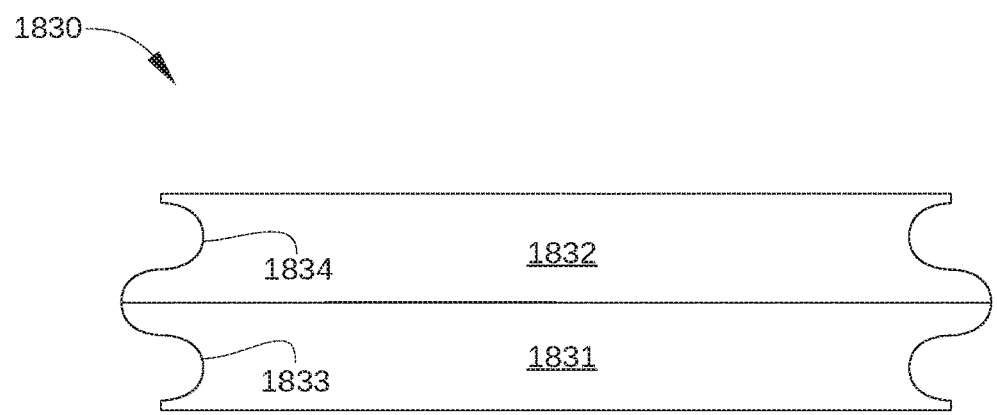
FIG. 18C schematically illustrates a side view of a heat exchanger, according to various embodiments of the present invention.

FIG. 18C schematically illustrates a side view of a heat exchanger 1830, according to various embodiments of the present invention. In FIG. 18C, heat exchanger 1830 includes a first portion 1831 of cooling fins (not shown individually for clarity) that are collectively configured to form a first termination profile 1833. In addition, heat exchanger 1830 includes a second portion 1832 of cooling fins (not shown individually for clarity) that are collectively configured to form a second termination profile 1834. As shown, first termination profile 1833 differs from second termination profile 1834, which significantly affects the flow rate of cooling air though first portion 1831 relative to second portion 1832.

Alternative Heat Pipe Configuration in Heat Exchanger

In embodiments described above, a first set of heat pipes is thermally coupled to an IC to distribute heat away from the IC, while a second set of heat pipes is thermally coupled to the first set of heat pipes and to a plurality of cooling fins. In such embodiments, each heat pipe in the second set of heat pipes includes an evaporator portion and at least one condenser portion that is perpendicular to the evaporator portion and is directly coupled to the plurality of cooling fins. In addition, each heat pipe in the first set of heat pipes includes an evaporator portion that is thermally coupled to the IC and perpendicular to the evaporator portions of the second set of heat pipes. In other embodiments, each heat pipe in the first set of heat pipes further includes at least one condenser portion that extends away from and is perpendicular to the evaporator portion of that heat pipe. In such embodiments, the condenser portion can also be directly coupled to the plurality of cooling fins. One such embodiment is illustrated in FIGS. 19A-19D.

Figure 19A:
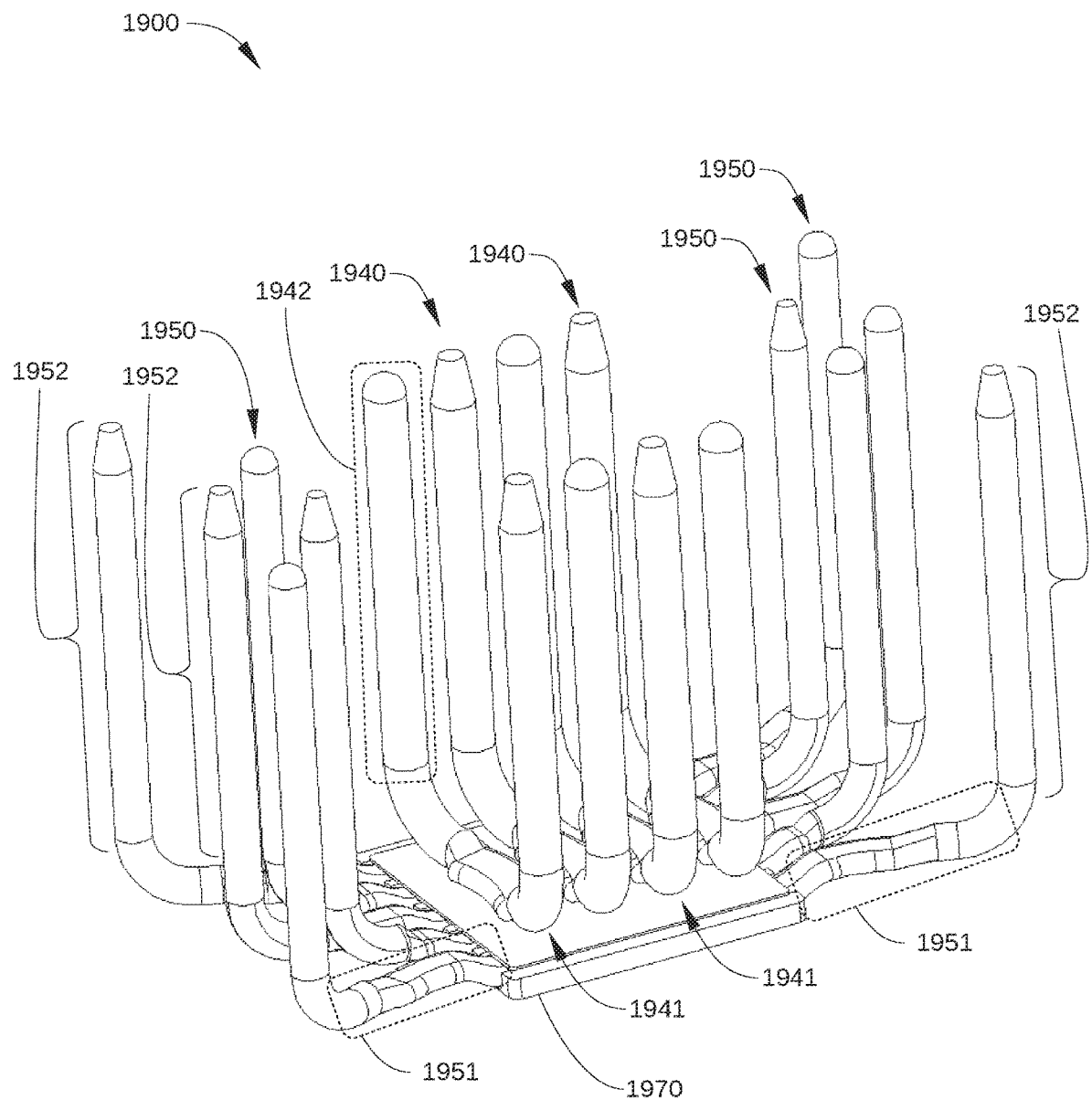
FIG. 19A schematically illustrates a perspective view of a heat exchanger with cooling fins and an auxiliary metallic plate omitted, according to various embodiments of the present invention.

FIG. 19A schematically illustrates a perspective view of a heat exchanger 1900 with cooling fins and an auxiliary metallic plate omitted, according to various embodiments of the present invention. Heat exchanger 1900 includes a first set of heat pipes 1950 and a second set of heat pipes 1940. Each heat pipe 1950 in the first set includes an evaporator portion 1951 and at least one condenser portion 1952, and each heat pipe 1940 in the second set includes an evaporator portion 1941 and at least one condenser portion 1942.

In some embodiments, in the first set of heat pipes 1950, the evaporator portion 1951 of each heat pipe 1950 is thermally coupled to an IC-contacting metallic plate 1970 that is in turn coupled to an IC (not shown). For example, in some embodiments, IC-contacting metallic plate 1970 is coupled to the IC in the same way that metallic plate 150 in FIG. 1 is coupled to IC 101. In such embodiments, evaporator portions 1951 may be embedded at least partially within IC-contacting metallic plate 1970. One such embodiment is illustrated in FIG. 20.

Figure 20:
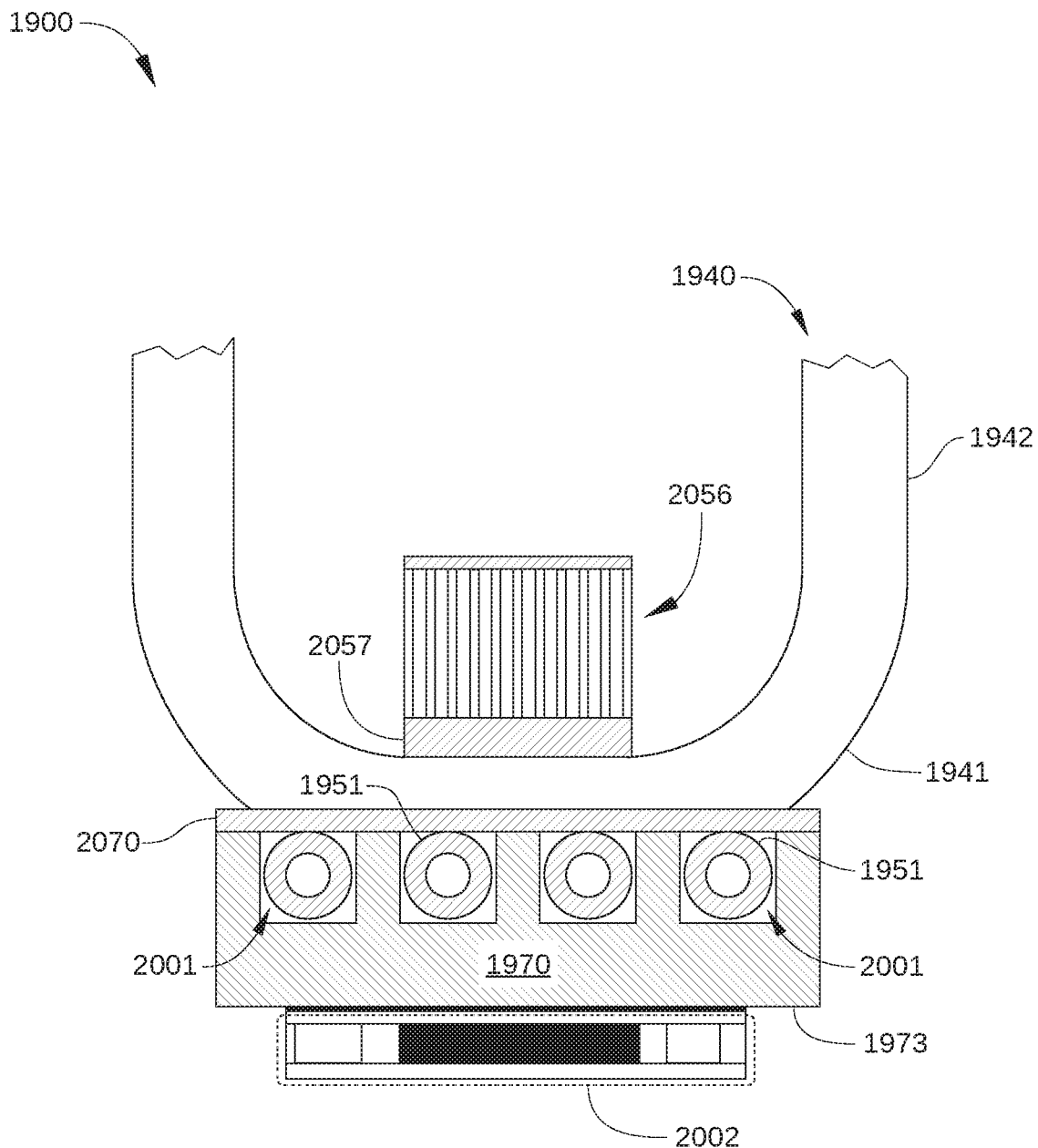
FIG. 20 schematically illustrates a cross-sectional view of evaporator portions and an IC-contacting metallic plate, according to an embodiment of the present invention.

FIG. 20 schematically illustrates a cross-sectional view of evaporator portions 1951 and IC-contacting metallic plate 1970, according to an embodiment of the present invention. Also shown are an IC 2002 coupled to a first surface 1973 of IC-contacting metallic plate 1970, an evaporator portion 1941 of heat pipes 1940 coupled to a second surface that is opposite to the first surface, portions of a condenser portion 1942 of one heat pipes 1940, and an array of plate-mounted cooling fins 2056. In the embodiment illustrated in FIG. 20, the array of plate-mounted cooling fins 2056 is coupled to one or more evaporator portions 1941 via an auxiliary metallic plate 2057.

In the embodiment, multiple cavities 2001 are formed in IC-contacting metallic plate 1970 and are each configured to accommodate at least a portion of one evaporator portion 1951 as shown. In some embodiments, space or air gaps between evaporator portions 1951 and corresponding surfaces of cavities 2001 are filled with a material that facilitates heat transfer from IC-contacting metallic plate 1970 and evaporator portions 1051, such as solder, thermal paste, and the like. In addition, in some embodiments, metallic plate 1070 further includes cover plate 2070 that facilitates coupling of evaporator portions 1941 of heat pipes 1940 onto IC-contacting metallic plate 1970. In such embodiments, cover plate 2070 may be soldered in place over cavities 2001 and evaporator portions 1951. Additionally or alternatively, in some embodiments, evaporator portions 1941 may be soldered in place onto cover plate 2070 to enhance heat transfer from IC-contacting metallic plate 1970 to evaporator portions 1941.

Returning to FIG. 19A, the at least one condenser portion 1952 of a particular heat pipe 1950 is perpendicular to the evaporator portion 1951 of that particular heat pipe 1950. That is, the condenser portion 1952 of each heat pipe 1950 extends away from IC-contacting metallic plate 1970 (and IC 2002, shown in FIG. 20). Further, the at least one condenser portion 1952 of each heat pipe 1950 is directly coupled to cooling fins (not shown) of heat exchanger 1900. For example, in some embodiments, the at least one condenser portion 1952 of each heat pipe 1950 is coupled to cooling fins in the same way that heat pipes 140 are coupled to cooling fins 121 in FIGS. 1A and 1B.

Figure 19B:
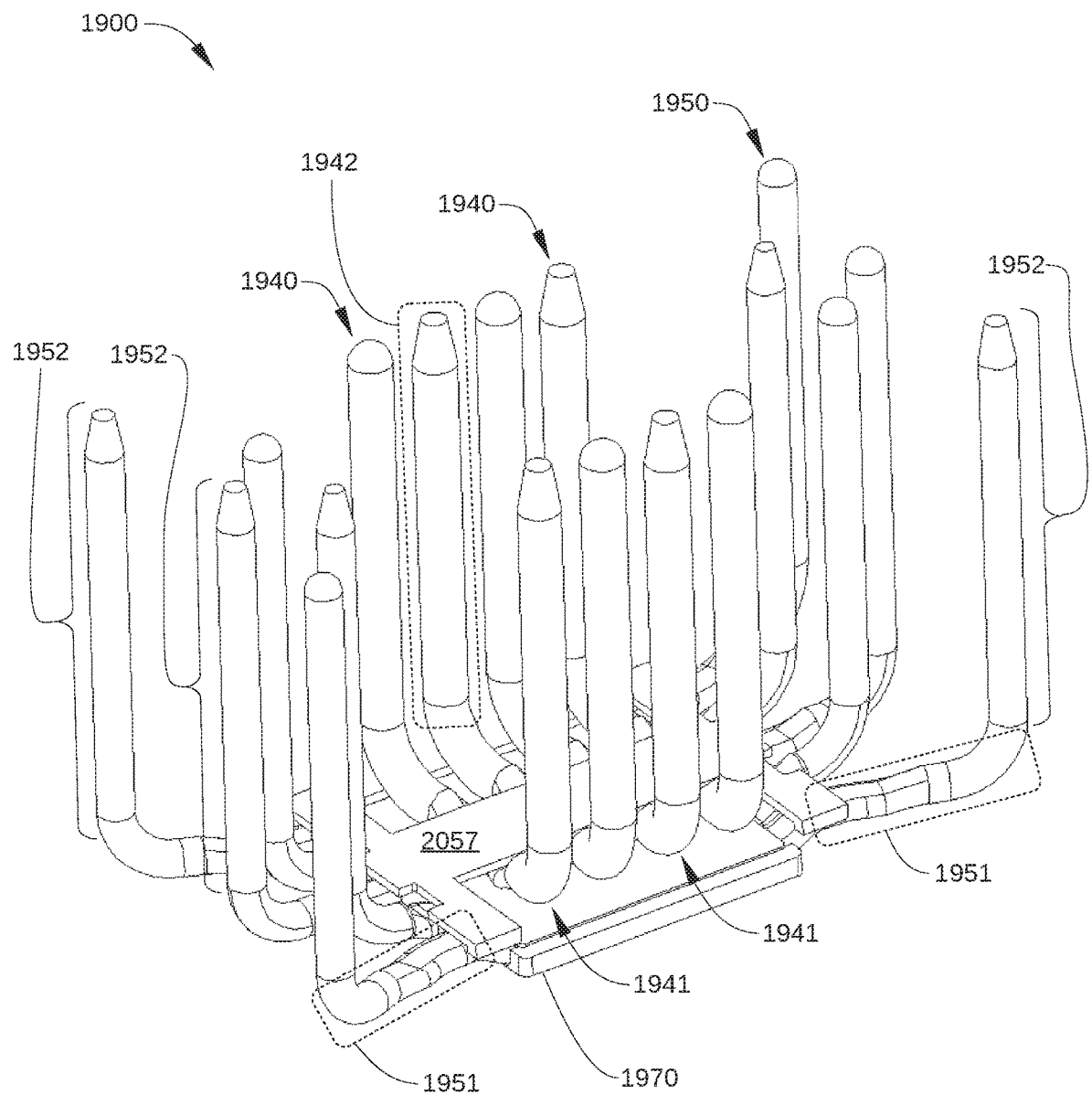
FIG. 19B schematically illustrates a perspective view of a heat exchanger with cooling fins omitted and an auxiliary metallic plate included, according to an embodiment of the present invention.

FIG. 19B schematically illustrates a perspective view of heat exchanger 1900 with cooling fins omitted and auxiliary metallic plate 2057 included, according to an embodiment of the present invention. As shown, auxiliary metallic plate 2057 is coupled to IC-contacting metallic plate 1970 and/or to evaporator portions 1941 of heat pipes 1940. In some embodiments, auxiliary metallic plate 2057 facilitates coupling of plate-mounted cooling fins 2056 onto IC-contacting metallic plate 1970 and/or onto evaporator portions 1941 of heat pipes 1940. One such embodiment is illustrated in FIG. 19C.

Figure 19C:
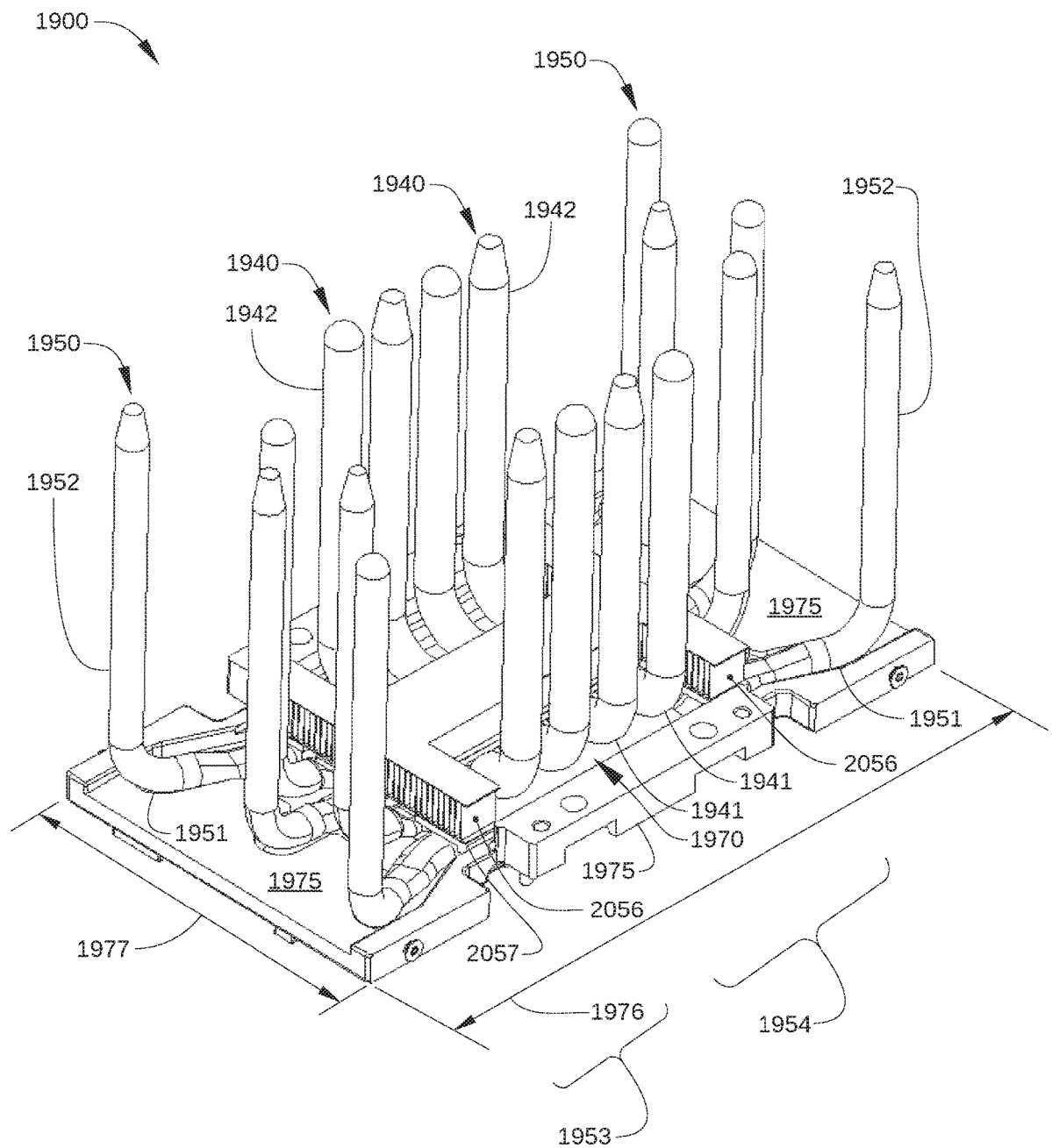
FIG. 19C schematically illustrates a perspective view of a heat exchanger with cooling fins omitted and an auxiliary metallic plate, plate-mounted cooling fins, and a base plate shown, according to an embodiment of the present invention.

FIG. 19C schematically illustrates a perspective view of heat exchanger 1900 with cooling fins omitted and auxiliary metallic plate 2057, plate-mounted cooling fins 2056, and a base plate 1975 shown, according to an embodiment of the present invention. Plate-mounted cooling fins 2056 are coupled to auxiliary metallic plate 2057 and are positioned proximate evaporator portions 1941 of heat pipes 1940 and IC-contacting metallic plate 1970. It is noted that cooling fins oriented parallel to IC-contacting metallic plate 1970 can be difficult to install proximate IC-contacting metallic plate 1970, due to the curved portions of evaporator portions 1941 and evaporator portions 1951. Thus, plate-mounted cooling fins 2056 facilitate heat transfer from evaporator portions 1941 of heat pipes 1940 and from IC-contacting metallic plate 1970 to cooling air flowing through a region that does not include cooling fins oriented parallel to IC-contacting metallic plate 1970.

As noted, FIG. 19C also shows an embodiment of a base plate 1975 that is configured to couple to IC-contacting metallic plate 1970, according to some embodiments. As shown, base plate 1975 is substantially similar in configuration to base plate 1050 of FIG. 10. Thus, in some embodiments, base plate 1975 is configured to mate with IC-contacting metallic plate 1970, to which heat pipes 1941 and 1951 are coupled. Base plate 1975 has a greater length 1976 and a greater width 1977 than IC-contacting metallic plate 1970, and therefore facilitates conductive heat transfer away from an IC across a wider surface than IC-contacting metallic plate 1970.

In some embodiments, condenser portions 1952 of heat pipes 1950 are disposed in a low-density heat-pipe area 1953 and condenser portions 1942 of heat pipes 1940 are disposed in a high-density heat-pipe area 1954. In such embodiments, a portion of IC-contacting metallic plate 1970, which is closest to IC 2002 and therefore is at the highest temperature during operation of IC 2002, has a higher density of heat pipes 1940 coupled thereto. By contrast, lower-temperature portions of IC-contacting metallic plate 1970, such as low-density heat-pipe area 1953, has a lower density of heat pipes 1940 coupled thereto.

Figure 19D:
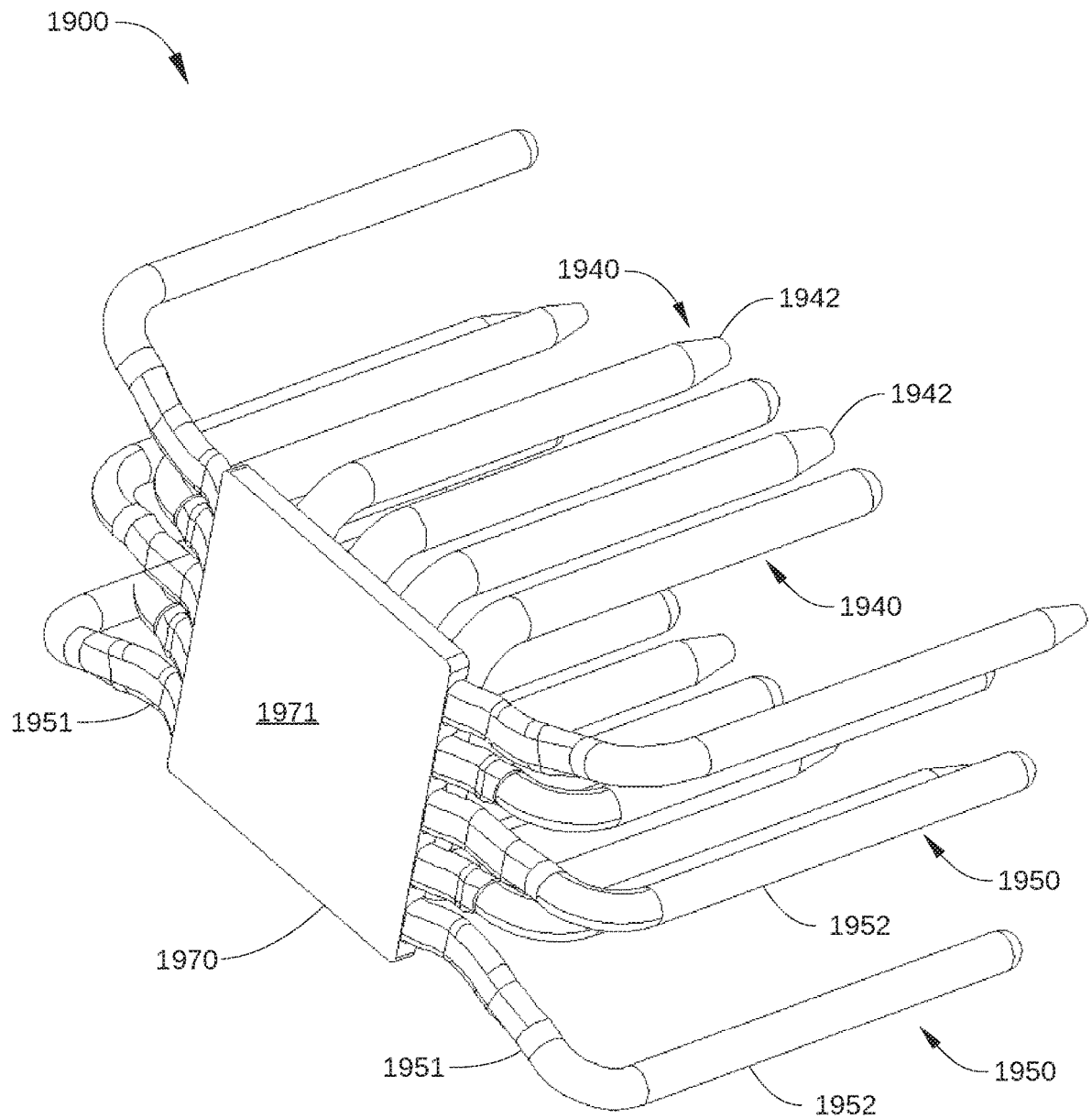
FIG. 19D schematically illustrates a perspective view of a heat exchanger with cooling fins omitted and an IC-contacting surface of an IC-contacting metallic plate shown, according to an embodiment of the present invention.

FIG. 19D schematically illustrates a perspective view of heat exchanger 1900 with cooling fins omitted and an IC-contacting surface 1971 of IC-contacting metallic plate 1970 shown, according to an embodiment of the present invention. In the embodiment illustrated in FIG. 19D, evaporator portions 1951 of heat pipes 1950 are at least partially embedded or otherwise disposed within IC-contacting metallic plate 1970. In addition, evaporator portions 1941 of heat pipes 1940 are coupled to a surface of IC-contacting metallic plate 1970 that is opposite to IC-contacting surface 1971.

In sum, embodiments of the present invention provide a heat exchanger for an IC that includes an integrated heat sink and at least one low pressure-drop plenum formed by cooling fins of the integrated heat sink. The low pressure-drop plenum is disposed proximate the IC, and causes a cooling fluid moving flowing across the heat exchanger to have higher-velocity proximate the IC. As a result, the heat transport capability of the heat exchanger is increased. Thus, for a specific pressure drop of the cooling fluid across the heat exchanger, the plenum formed by the cooling fins enables greater heat removal from the IC.

At least one technological advantage of the disclosed heat exchanger design relative to the prior art is that heat generated by an IC can be more efficiently removed from the IC, thereby enabling the IC to operate at higher processing speeds without overheating. A further advantage is that pressure drop across the disclosed heat exchanger is typically less than the pressure drop across conventional heat exchangers, which reduces fan power consumption and fan noise relative to conventional heat exchanger designs. These technological advantages provide one or more technological advancements over prior art approaches.

1. In some embodiments, an electronic device, includes: an integrated circuit; and a heat exchanger that includes: at least one heat pipe that is thermally coupled to the integrated circuit and has an evaporator portion and a condenser portion, wherein the condenser portion extends away from the evaporator portion; and a first plurality of cooling fins that are attached to the condenser portion and proximate to the evaporation portion and form a plenum having a first associated pressure drop when a cooling fluid flows across the first plurality of cooling fins at a first velocity; and a second plurality of cooling fins that are attached to the condenser portion and distal from the evaporation portion and form a flow path having a second associated pressure drop when the cooling fluid flows across the second plurality of cooling fins at the first velocity.

2. The electronic device of clause 1, wherein the heat exchanger further comprises: a second heat pipe that is thermally coupled to the integrated circuit and has an evaporator portion and a condenser portion; and a third plurality of cooling fins that are thermally coupled to the IC and disposed between the evaporator portion of the first heat pipe and the evaporator portion of the second heat pipe.

3. The electronic device of clauses 1 or 2, wherein the cooling fins in the third plurality of cooling fins extend away from the integrated circuit into an airflow region that encompasses a curved portion of the first heat pipe and a curved portion of the second heat pipe.

4. The electronic device of any of clauses 1-3, wherein the cooling fins in the third plurality of cooling fins are mounted on a first side of a metallic plate and the integrated circuit is mounted on a second side of the metallic plate opposite to the first side.

5. The electronic device of any of clauses 1-4, wherein the evaporator portion is parallel to a first surface of the integrated circuit and the condenser portion is perpendicular to the first surface of the integrated circuit.

6. The electronic device of any of clauses 1-5, wherein the plenum is formed in an edge region of the heat exchanger.

7. The electronic device of any of clauses 1-6, wherein each fin in the first plurality of fins has a respective length in a direction of cooling fluid flow that is less than a length of fins in the second plurality of fins in the direction of cooling fluid.

8. The electronic device of any of clauses 1-7, wherein the second pressure drop is greater than the first pressure drop.

9. The electronic device of any of clauses 1-8, wherein the integrated circuit is coupled to a first side of a metallic plate and the evaporator portion is coupled to a second side of the metallic plate opposite to the first side.

10. The electronic device of any of clauses 1-9, wherein: the condenser portion comprises a first straight segment coupled to the evaporator portion via a first curved segment and a second straight segment coupled to the evaporator portion via a second curved segment, and the heat exchanger further comprises a third plurality of cooling fins that are thermally coupled to the metallic plate and disposed between the first curved segment and the second curved segment.

11. The electronic device of any of clauses 1-10, wherein the at least one heat pipe includes a heat pipe embedded in the metal plate.

12. The electronic device of any of clauses 1-11, wherein the evaporator portion comprises a straight section and the heat pipe embedded in the metal plate is perpendicular to the straight section.

13. The electronic device of any of clauses 1-12, wherein each cooling fin in the first plurality of cooling fins is separated by a first fin pitch, each cooling fin in the second plurality of cooling fins is separated by a second fin pitch, and wherein the first fin pitch is greater than the second fin pitch.

14. The electronic device of any of clauses 1-13, wherein each cooling fin in the first plurality of cooling fins has a first fin length, and each cooling fin in the second plurality of cooling fins has a second fin length.

15. The electronic device of any of clauses 1-14, wherein the first fin length is equal to the second fin length.

16. The electronic device of any of clauses 1-15, wherein the respective lengths of the cooling fins in the first plurality of cooling fins correspond to a first termination profile, and the respective lengths of the cooling fins in the second plurality of cooling fins correspond to a second termination profile.

17. An electronic device that includes an integrated circuit and a heat exchanger, the heat exchanger comprising: at least one heat pipe that is thermally coupled to the integrated circuit and has an evaporator portion and a condenser portion, wherein the condenser portion extends away from the evaporator portion; a first plurality of cooling fins that are proximate to the evaporation portion and form a plenum; and a second plurality of cooling fins that are distal from the evaporation portion and form a flow path, wherein the plenum is configured to cause a first portion of cooling fluid to flow through the plenum at a first velocity and through the flow path at a second velocity, wherein the first velocity is greater than the second velocity.

18. The electronic device of clause 17, wherein the plenum is formed in an edge region of the heat exchanger.

19. The electronic device of clauses 17 or 18, wherein each fin in the first plurality of cooling fins has a respective length in a direction of cooling fluid flow that is less than a length of cooling fins in the second plurality of fins in the direction of cooling fluid.

20. The electronic device of any of clauses 17-19, wherein the respective lengths of the cooling fins in the first plurality of cooling fins correspond to a termination profile.

21. In some embodiments, a heat exchanger includes: a first heat pipe that includes a first evaporator portion and a first condenser portion, wherein the first condenser portion extends away from the first evaporator portion; a second heat pipe that is thermally coupled to the first heat pipe and includes a second evaporator portion and a second condenser portion; and a plurality of cooling fins, wherein each cooling fin included in the plurality of cooling fins is attached to the second condenser portion.

22. The heat exchanger of clause 21, wherein the second evaporator portion is mechanically coupled to the first heat pipe.

23. The heat exchanger of clauses 21 or 22, further comprising a metallic plate having a first surface to which the first heat pipe is coupled.

24. The heat exchanger of any of clauses 21-23, further comprising an integrated circuit that is coupled to a second surface of the metallic plate, wherein the second surface of the metallic plate is opposite to the first surface of the metallic plate.

25. The heat exchanger of any of clauses 21-24, wherein the first surface is directly coupled to the first evaporator portion.

26. The heat exchanger of any of clauses 21-25, wherein the first heat pipe is included in a plurality of heat pipes that are directly coupled to the first surface of the metallic plate.

27. The heat exchanger of any of clauses 21-26, wherein the first heat pipe is at least partially disposed within the metallic plate.

28. The heat exchanger of any of clauses 21-27, wherein the plurality of cooling fins includes: a first group of fins that are proximate to the second evaporation portion and form a plenum; and a second group of fins that are distal from the second evaporation portion and form a flow path.

29. The heat exchanger of any of clauses 21-28, wherein the plenum has a first associated pressure drop when a cooling fluid flows across the first group of cooling fins at a first velocity, and the flow path has a second associated pressure drop when the cooling fluid flows across the second group of cooling fins at the first velocity.

30. The heat exchanger of any of clauses 21-29, wherein the second evaporator portion is perpendicular to the second condenser portion.

31. The heat exchanger of any of clauses 21-30, wherein the second heat pipe is included in a plurality of heat pipes, where each heat pipe in the plurality of heat pipes has an evaporator portion and a condenser portion that is perpendicular to the evaporator portion.

32. The heat exchanger of any of clauses 21-31, wherein the first evaporator portion is perpendicular to the first condenser portion.

33. The heat exchanger of any of clauses 21-32, wherein the second evaporator portion is perpendicular to the second condenser portion, and the first condenser is parallel to the second condenser portion.

34. The heat exchanger of any of clauses 21-33, wherein each cooling fin included in the plurality of cooling fins is attached to the first condenser portion.

35. In some embodiments, an electronic device includes a first integrated circuit thermally coupled to a first heat exchanger, the first heat exchanger comprising: a first heat pipe that includes a first evaporator portion and a first condenser portion, wherein the first condenser portion extends away from the first evaporator portion; a second heat pipe that is thermally coupled to the first heat pipe and includes a second evaporator portion and a second condenser portion; and a plurality of cooling fins, wherein each cooling fin included in the plurality of cooling fins is attached to the second condenser portion.

36. The electronic device of clause 35, wherein the second evaporator portion is mechanically coupled to the first heat pipe.

37. The electronic device of clause 35 or 36, further comprising a metallic plate having a first surface to which the first heat pipe is coupled.

38. The electronic device of any of clauses 35-37, further comprising: a printed circuit board on which the first integrated circuit is mounted; a second integrated circuit that is mounted on the printed circuit board; and a second heat exchanger that is thermally coupled to the second integrated circuit.

39. The electronic device of any of clauses 35-38, wherein the first heat exchanger and the second heat exchanger are positioned on the printed circuit board to allow a cooling fluid to flow first through the first heat exchanger and then through the second heat exchanger.

40. The electronic device of any of clauses 35-39, wherein: the first heat exchanger includes a first plurality of cooling fins; and the second heat exchanger include a second plurality of cooling fins that are disposed parallel to the first plurality of cooling fins.

41. The electronic device of any of clauses 35-40, wherein: the first heat pipe is included in a first plurality of heat pipes, wherein each heat pipe included in the first plurality of heat pipes has a third condenser portion; the second heat pipe is included in a second plurality of heat pipes, wherein each heat pipe included in the second plurality of heat pipes has a fourth condenser portion; and the third condenser portions are arranged within the first heat exchanger at a first density, and the second condenser portions are arranged within the first heat exchanger at a second density that is less than the first density.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

While the preceding is directed to embodiments of the present disclosure, other and further embodiments of the disclosure may be devised without departing from the basic scope thereof, and the scope thereof is determined by the claims that follow.

What is claimed is:

1. An electronic device, comprising:
an integrated circuit; and
a heat exchanger that includes:
a plurality of heat pipes that are thermally coupled to the integrated circuit, wherein each heat pipe included in the plurality of heat pipes has an evaporator portion and a condenser portion, wherein the condenser portion extends away from the evaporator portion;
a first plurality of cooling fins that are attached to a first heat pipe included in the plurality of heat pipes but is not attached to a second heat pipe included in the plurality of heat pipes, wherein the first plurality of cooling fins are attached to a bottom portion of the condenser portion that is proximate to the evaporator portion of the first heat pipe, wherein respective lengths of the cooling fins in the first plurality of cooling fins correspond to at least one of a termination profile associated with a parabolic function or a termination profile associated with a linear function that approaches a minimum for a final cooling fin in the first plurality of cooling fins that is closest to the integrated circuit; and
a second plurality of cooling fins that are attached to each heat pipe included in the plurality of heat pipes, wherein the second plurality of cooling fins are attached to a top portion of the condenser portion that is most distal from the evaporator portion of each heat pipe included in the plurality of heat pipes, wherein the top portion of the condenser portion of each heat pipe included in the plurality of heat pipes is not attached to any cooling fin that is attached to the first heat pipe but is not attached to the second heat pipe.

2. The electronic device of claim 1, wherein the heat exchanger further comprises:
a third heat pipe that is thermally coupled to the integrated circuit and has an evaporator portion and a condenser portion; and
a third plurality of cooling fins that are thermally coupled to the integrated circuit and disposed between an evaporator portion of a fourth heat pipe and the evaporator portion of the third heat pipe.

3. The electronic device of claim 2, wherein the cooling fins in the third plurality of cooling fins extend away from the integrated circuit into an airflow region that encompasses a curved portion of the fourth heat pipe and a curved portion of the third heat pipe.

4. The electronic device of claim 2, wherein the cooling fins in the third plurality of cooling fins are mounted on a first side of a metallic plate and the integrated circuit is mounted on a second side of the metallic plate opposite to the first side.

5. The electronic device of claim 1, wherein the evaporator portion of each heat pipe included in the plurality of heat pipes is parallel to a first surface of the integrated circuit and the condenser portion of each heat pipe included in the plurality of heat pipes is perpendicular to the first surface of the integrated circuit.

6. The electronic device of claim 1, wherein the first plurality of cooling fins form a plenum in an edge region of the heat exchanger.

7. The electronic device of claim 1, wherein each cooling fin in the first plurality of cooling fins has a respective length in the direction of a cooling fluid flow that is less than a length of cooling fins in the second plurality of cooling fins in the direction of the cooling fluid flow.

8. The electronic device of claim 1, wherein the first plurality of cooling fins form a plenum and the second plurality of cooling fins form a flow path, wherein the plenum has a first associated pressure drop when a cooling fluid flows across the first plurality of cooling fins at a first velocity, the flow path has a second associated pressure drop when the cooling fluid flows across the second plurality of cooling fins at a second velocity, and the second pressure drop is greater than the first pressure drop.

9. The electronic device of claim 1, wherein the integrated circuit is coupled to a first side of a metallic plate and the evaporator portion of each heat pipe included in the plurality of heat pipes is coupled to a second side of the metallic plate opposite to the first side.

10. The electronic device of claim 9, wherein:
for each heat pipe included in the plurality of heat pipes, the condenser portion comprises a first straight segment coupled to the evaporator portion via a first curved segment and a second straight segment coupled to the evaporator portion via a second curved segment, and
the heat exchanger further comprises a third plurality of cooling fins that are thermally coupled to the metallic plate and disposed between the first curved segment and the second curved segment.

11. The electronic device of claim 9, wherein the plurality of heat pipes includes a heat pipe embedded in the metal plate.

12. The electronic device of claim 11, wherein the evaporator portion of each heat pipe included in the plurality of heat pipes comprises a straight section and the heat pipe embedded in the metal plate is perpendicular to the straight section.

13. The electronic device of claim 1, wherein each cooling fin in the first plurality of cooling fins is separated by a first fin pitch, each cooling fin in the second plurality of cooling fins is separated by a second fin pitch, and wherein the first fin pitch is greater than the second fin pitch.

14. The electronic device of claim 13, wherein each cooling fin in the first plurality of cooling fins has a respective length in the direction of a cooling fluid flow that is less than a length of cooling fins in the second plurality of cooling fins in the direction of the cooling fluid flow.

15. The electronic device of claim 1, wherein the respective lengths of the cooling fins in the first plurality of cooling fins correspond to a first termination profile, and the respective lengths of the cooling fins in the second plurality of cooling fins correspond to a second termination profile.

16. An electronic device that includes an integrated circuit and a heat exchanger, the heat exchanger comprising:
a plurality of heat pipes that are thermally coupled to the integrated circuit, wherein each heat pipe included in the plurality of heat pipes has an evaporator portion and a condenser portion, wherein the condenser portion extends away from the evaporator portion;
a first plurality of cooling fins that are attached to a first heat pipe included in the plurality of heat pipes but is not attached to a second heat pipe included in the plurality of heat pipes, wherein the first plurality of cooling fins are attached to a bottom portion of the condenser portion that is proximate to the evaporator portion of the first heat pipe, wherein respective lengths of the cooling fins in the first plurality of cooling fins correspond to at least one of a termination profile associated with a parabolic function or a termination profile associated with a linear function that approaches a minimum for a final cooling fin in the first plurality of cooling fins that is closest to the integrated circuit; and a second plurality of cooling fins that are attached to each heat pipe included in the plurality of heat pipes, wherein the second plurality of cooling fins are attached to a top portion of the condenser portion that is most distal from the evaporator portion of each heat pipe included in the plurality of heat pipes, wherein the top portion of the condenser portion of each heat pipe included in the plurality of heat pipes is not attached to any cooling fin that is attached to the first heat pipe but is not attached to the second heat pipe.

17. The electronic device of claim 16, wherein the first plurality of cooling fins form a plenum in an edge region of the heat exchanger.

18. The electronic device of claim 16, wherein each cooling fin in the first plurality of cooling fins has a respective length in the direction of a cooling fluid flow that is less than a length of cooling fins in the second plurality of cooling fins in the direction of the cooling fluid flow.

19. The electronic device of claim 18, wherein the respective lengths of the cooling fins in the first plurality of cooling fins correspond to a termination profile.

20. A heat exchanger, comprising:
a first heat pipe that includes a first evaporator portion and a first condenser portion, wherein the first condenser portion extends away from the first evaporator portion;
a second heat pipe that is thermally coupled to the first heat pipe and includes a second evaporator portion and a second condenser portion;
a first plurality of cooling fins that are attached to a first bottom portion of the first condenser portion that is proximate to the first evaporation portion of the first heat pipe, wherein the first plurality of cooling fins are not attached to the second heat pipe, and wherein respective lengths of the cooling fins in the first plurality of cooling fins correspond to at least one of a termination profile associated with a parabolic function or a termination profile associated with a linear function that approaches a minimum for a final cooling fin in the first plurality of cooling fins that is closest to an integrated circuit; and
a second plurality of cooling fins that are attached to a first top portion of the first condenser portion that is most distal from the first evaporation portion of the first heat pipe, attached to a second top portion of the second condenser portion that is most distal from the second evaporation portion of the second heat pipe, wherein the first top portion of the first condenser portion of the first heat pipe is not attached to any cooling fin that is attached to the first heat pipe but is not attached to the second heat pipe and the second top portion of second the condenser portion of the second heat pipe is not attached to any cooling fin that is attached to the first heat pipe but is not attached to the second heat pipe.

21. The heat exchanger of claim 20, wherein the second evaporator portion is mechanically coupled to the first heat pipe.

22. The heat exchanger of claim 20, further comprising a metallic plate having a first surface to which the first heat pipe is coupled.

23. The heat exchanger of claim 22, further comprising the integrated circuit that is coupled to a second surface of the metallic plate, wherein the second surface of the metallic plate is opposite to the first surface of the metallic plate.

24. The heat exchanger of claim 22, wherein the first surface is directly coupled to the first evaporator portion.

25. The heat exchanger of claim 24, wherein the first heat pipe is included in a plurality of heat pipes that are directly coupled to the first surface of the metallic plate.

26. The heat exchanger of claim 22, wherein the first heat pipe is at least partially disposed within the metallic plate.

27. The heat exchanger of claim 20, wherein:
the first plurality of cooling fins are proximate to the second evaporation portion; and
the second plurality of cooling fins are distal from the second evaporation portion.

28. The heat exchanger of claim 20, wherein the first plurality of cooling fins form a plenum and the second plurality of cooling fins form a flow path, wherein the plenum is configured to cause a cooling fluid to flow through the plenum at a first velocity and through the flow path at a second velocity, and the plenum has a first associated pressure drop when the cooling fluid flows across the first plurality of cooling fins at the first velocity, and the flow path has a second associated pressure drop when the cooling fluid flows across the second plurality of cooling fins at the second velocity.

29. The heat exchanger of claim 20, wherein the second evaporator portion is perpendicular to the second condenser portion.

30. The heat exchanger of claim 29, wherein the second heat pipe is included in a plurality of heat pipes, where each heat pipe in the plurality of heat pipes has an evaporator portion and a condenser portion that is perpendicular to the evaporator portion.

31. The heat exchanger of claim 20, wherein the first evaporator portion is perpendicular to the first condenser portion.

32. The heat exchanger of claim 31, wherein the second evaporator portion is perpendicular to the second condenser portion, and the first condenser is parallel to the second condenser portion.

33. An electronic device that includes a first integrated circuit thermally coupled to a first heat exchanger, the first heat exchanger comprising:
a first heat pipe that includes a first evaporator portion and a first condenser portion, wherein the first condenser portion extends away from the first evaporator portion;
a second heat pipe that is thermally coupled to the first heat pipe and includes a second evaporator portion and a second condenser portion;
a first plurality of cooling fins that are attached to a first bottom portion of the first condenser portion that is proximate to the first evaporation portion of the first heat pipe, wherein the first plurality of cooling fins are not attached to the second heat pipe; and
a first plurality of cooling fins that are attached to a first bottom portion of the first condenser portion that is proximate to the first evaporation portion of the first heat pipe, wherein the first plurality of cooling fins are not attached to the second heat pipe, and wherein respective lengths of the cooling fins in the first plurality of cooling fins correspond to at least one of a termination profile associated with a parabolic function or a termination profile associated with a linear function that approaches a minimum for a final cooling fin in the first plurality of cooling fins that is closest to the first integrated circuit; and
a second plurality of cooling fins that are attached to a first top portion of the first condenser portion that is most distal from the first evaporation portion of the first heat pipe, attached to a second top portion of the second condenser portion that is most distal from the second evaporation portion of the second heat pipe, wherein the first top portion of the first condenser portion of the first heat pipe is not attached to any cooling fin that is attached to the first heat pipe but is not attached to the second heat pipe and the second top portion of second the condenser portion of the second heat pipe is not attached to any cooling fin that is attached to the first heat pipe but is not attached to the second heat pipe.

34. The electronic device of claim 33, wherein the second evaporator portion is mechanically coupled to the first heat pipe.

35. The electronic device of claim 33, further comprising a metallic plate having a first surface to which the first heat pipe is coupled.

36. The electronic device of claim 33, further comprising:
a printed circuit board on which the first integrated circuit is mounted;
a second integrated circuit that is mounted on the printed circuit board; and
a second heat exchanger that is thermally coupled to the second integrated circuit.

37. The electronic device of claim 36, wherein the first heat exchanger and the second heat exchanger are positioned on the printed circuit board to allow the cooling fluid to flow first through the first heat exchanger and then through the second heat exchanger.

38. The electronic device of claim 37, wherein:
the second heat exchanger include a third plurality of cooling fins that are disposed parallel to the first plurality of cooling fins.

39. The electronic device of claim 33, wherein:
the first heat pipe is included in a first plurality of heat pipes, wherein each heat pipe included in the first plurality of heat pipes has a third condenser portion;
the second heat pipe is included in a second plurality of heat pipes, wherein each heat pipe included in the second plurality of heat pipes has a fourth condenser portion; and
the third condenser portions are arranged within the first heat exchanger at a first density, and the second condenser portions are arranged within the first heat exchanger at a second density that is less than the first density.

* * * * *